United States Patent
Purayath et al.

(10) Patent No.: US 11,751,391 B2
(45) Date of Patent: Sep. 5, 2023

(54) METHODS FOR FABRICATING A 3-DIMENSIONAL MEMORY STRUCTURE OF NOR MEMORY STRINGS

(71) Applicant: SUNRISE MEMORY CORPORATION, San Jose, CA (US)

(72) Inventors: Vinod Purayath, Sedona, AZ (US); Yosuke Nosho, Tokyo (JP); Shohei Kamisaka, Kanagawa (JP); Michiru Nakane, Tokyo (JP); Eli Harari, Saratoga, CA (US)

(73) Assignee: SUNRISE MEMORY CORPORATION, San Jose, CA (US)

( * ) Notice: Subject to any disclaimer, the term of this patent is extended or adjusted under 35 U.S.C. 154(b) by 44 days.

(21) Appl. No.: 17/382,126

(22) Filed: Jul. 21, 2021

(65) Prior Publication Data
US 2022/0028886 A1 Jan. 27, 2022
US 2023/0247831 A9 Aug. 3, 2023

Related U.S. Application Data

(63) Continuation-in-part of application No. 16/914,089, filed on Jun. 26, 2020, now Pat. No. 11,177,281, which is a continuation of application No. 16/510,610, filed on Jul. 12, 2019, now Pat. No. 10,741,581.

(60) Provisional application No. 62/697,085, filed on Jul. 12, 2018, provisional application No. 63/054,750, filed on Jul. 21, 2020.

(51) Int. Cl.
H01L 21/28 (2006.01)
H10B 43/27 (2023.01)
H01L 29/51 (2006.01)

(52) U.S. Cl.
CPC ........ *H10B 43/27* (2023.02); *H01L 29/40117* (2019.08); *H01L 29/513* (2013.01); *H01L 29/517* (2013.01); *H01L 29/518* (2013.01)

(58) Field of Classification Search
CPC ......... H01L 27/11582; H01L 29/40117; H01L 29/513; H01L 29/517; H01L 29/518
See application file for complete search history.

(56) References Cited

U.S. PATENT DOCUMENTS

| | | | |
|---|---|---|---|
| 5,583,808 A | 12/1996 | Brahmbhatt | |
| 5,646,886 A | 7/1997 | Brahmbhatt | |

(Continued)

FOREIGN PATENT DOCUMENTS

| | | |
|---|---|---|
| JP | 2010-010349 A2 | 1/2010 |
| KR | 20120085591 A1 | 8/2012 |
| WO | 2018236937 A1 | 12/2018 |

OTHER PUBLICATIONS

"PCT Search Report and Written Opinion, PCT/US2021/42620", dated Oct. 28, 2021, 18 pages.

(Continued)

*Primary Examiner* — Mohammad M Choudhry
(74) *Attorney, Agent, or Firm* — Edward C. Kwok; VLP Law Group LLP

(57) ABSTRACT

A process for building a 3-Dimensional NOR memory array avoids the challenge of etching a conductor material that is aimed at providing local word lines at a fine pitch. The process defines the local word lines between isolation shafts that may be carried out at a lower aspect ratio than would be required for etching the conductor material.

27 Claims, 22 Drawing Sheets

(56) References Cited

U.S. PATENT DOCUMENTS

| | | | |
|---|---|---|---|
| 5,656,842 A | 8/1997 | Iwamatsu | |
| 5,768,192 A | 6/1998 | Eitan | |
| 5,789,776 A | 8/1998 | Lancaster et al. | |
| 5,915,167 A | 6/1999 | Leedy | |
| 6,040,605 A | 3/2000 | Sano et al. | |
| 6,107,133 A | 8/2000 | Furukawa | |
| 6,118,171 A | 9/2000 | Davies et al. | |
| 6,130,838 A | 10/2000 | Kim et al. | |
| 6,313,518 B1 * | 11/2001 | Ahn | H01L 21/02216 |
| | | | 257/632 |
| 6,362,508 B1 | 3/2002 | Rasovaky et al. | |
| 6,434,053 B1 | 8/2002 | Fujiwara | |
| 6,580,124 B1 | 6/2003 | Cleeves et al. | |
| 6,587,365 B1 | 7/2003 | Sailing | |
| 6,744,094 B2 | 6/2004 | Forbes | |
| 6,754,105 B1 | 6/2004 | Chang et al. | |
| 6,774,458 B2 | 8/2004 | Fricke et al. | |
| 6,781,858 B2 | 8/2004 | Fricke et al. | |
| 6,873,004 B1 | 3/2005 | Han et al. | |
| 6,946,703 B2 | 9/2005 | Ryu et al. | |
| 7,005,350 B2 | 2/2006 | Walker et al. | |
| 7,223,653 B2 | 5/2007 | Cheng et al. | |
| 7,307,308 B2 | 12/2007 | Lee | |
| 7,349,250 B2 | 3/2008 | Ito et al. | |
| 7,489,002 B2 | 2/2009 | Forbes et al. | |
| 7,512,012 B2 | 3/2009 | Kuo | |
| 7,524,725 B2 | 4/2009 | Chung | |
| 7,612,411 B2 | 11/2009 | Walker | |
| 8,026,521 B1 | 9/2011 | Or-Bach et al. | |
| 8,139,418 B2 | 3/2012 | Carman | |
| 8,178,396 B2 | 5/2012 | Sinha et al. | |
| 8,278,183 B2 | 10/2012 | Lerner | |
| 8,383,482 B2 | 2/2013 | Kim et al. | |
| 8,630,114 B2 | 1/2014 | Lue | |
| 8,743,612 B2 | 6/2014 | Choi et al. | |
| 8,767,473 B2 | 7/2014 | Shim et al. | |
| 8,848,425 B2 | 9/2014 | Schloss | |
| 8,878,278 B2 | 11/2014 | Alsmeier et al. | |
| 9,190,293 B2 | 11/2015 | Wang et al. | |
| 9,202,694 B2 | 12/2015 | Konevecki et al. | |
| 9,230,985 B1 | 1/2016 | Wu et al. | |
| 9,245,900 B2 | 1/2016 | Hosoda et al. | |
| 9,412,752 B1 | 8/2016 | Yeh et al. | |
| 9,698,152 B2 | 7/2017 | Peri | |
| 9,711,529 B2 | 7/2017 | Hu et al. | |
| 9,748,172 B2 | 8/2017 | Takaki | |
| 9,842,651 B2 | 12/2017 | Harari | |
| 9,892,800 B2 | 2/2018 | Harari | |
| 9,911,497 B1 | 3/2018 | Harari | |
| 10,014,317 B2 | 7/2018 | Peng | |
| 10,074,667 B1 | 9/2018 | Higashi | |
| 10,096,364 B2 | 10/2018 | Harari | |
| 10,121,553 B2 | 11/2018 | Harari | |
| 10,157,780 B2 | 12/2018 | Wu et al. | |
| 10,249,370 B2 | 4/2019 | Harari | |
| 10,254,968 B1 | 4/2019 | Gazit et al. | |
| 10,373,956 B2 | 8/2019 | Gupta et al. | |
| 10,381,378 B1 | 8/2019 | Harari | |
| 10,395,737 B2 | 8/2019 | Harari | |
| 10,431,596 B2 | 10/2019 | Herner et al. | |
| 10,475,812 B2 | 11/2019 | Harari | |
| 10,622,377 B2 | 4/2020 | Harari et al. | |
| 2001/0030340 A1 | 10/2001 | Fujiwara | |
| 2001/0053092 A1 | 12/2001 | Kosaka et al. | |
| 2002/0028541 A1 | 3/2002 | Lee et al. | |
| 2002/0051378 A1 | 5/2002 | Ohsawa | |
| 2002/0193484 A1 | 12/2002 | Albee | |
| 2004/0000679 A1 | 1/2004 | Patel et al. | |
| 2004/0214387 A1 | 10/2004 | Madurawe et al. | |
| 2004/0246807 A1 | 12/2004 | Lee | |
| 2004/0262681 A1 | 12/2004 | Masuoka et al. | |
| 2004/0262772 A1 | 12/2004 | Ramanathan et al. | |
| 2005/0128815 A1 | 6/2005 | Ishikawa et al. | |
| 2005/0236625 A1 | 10/2005 | Schuele et al. | |
| 2005/0280061 A1 | 12/2005 | Lee | |
| 2006/0155921 A1 | 7/2006 | Gorobets et al. | |
| 2008/0160765 A1 * | 7/2008 | Lee | H01L 21/31122 |
| | | | 438/700 |
| 2008/0239812 A1 | 10/2008 | Naofumi et al. | |
| 2008/0266960 A1 | 10/2008 | Kuo | |
| 2009/0057722 A1 | 3/2009 | Masuoka et al. | |
| 2009/0157946 A1 | 6/2009 | Arya | |
| 2009/0237996 A1 | 9/2009 | Kirsch et al. | |
| 2009/0279360 A1 | 11/2009 | Peter et al. | |
| 2009/0316487 A1 | 12/2009 | Lee et al. | |
| 2010/0124116 A1 | 5/2010 | Takashi et al. | |
| 2011/0047325 A1 | 2/2011 | Mishima | |
| 2011/0115011 A1 | 5/2011 | Masuoka et al. | |
| 2011/0143519 A1 | 6/2011 | Lerner | |
| 2011/0208905 A1 | 8/2011 | Shaeffer et al. | |
| 2011/0298013 A1 | 12/2011 | Hwang et al. | |
| 2012/0074478 A1 | 3/2012 | Sugimachi | |
| 2012/0182801 A1 | 7/2012 | Lue | |
| 2012/0223380 A1 | 9/2012 | Lee et al. | |
| 2012/0243314 A1 | 9/2012 | Takashi | |
| 2012/0307568 A1 | 12/2012 | Banna et al. | |
| 2012/0327714 A1 | 12/2012 | Lue | |
| 2013/0256780 A1 | 10/2013 | Kai et al. | |
| 2013/0337646 A1 | 12/2013 | Cernea et al. | |
| 2014/0015036 A1 | 1/2014 | Fursin et al. | |
| 2014/0070289 A1 | 3/2014 | Tanaka et al. | |
| 2014/0117366 A1 | 5/2014 | Saitoh | |
| 2014/0151774 A1 | 6/2014 | Rhie | |
| 2014/0213032 A1 * | 7/2014 | Kai | H01L 45/149 |
| | | | 438/382 |
| 2014/0247674 A1 | 9/2014 | Karda et al. | |
| 2014/0252454 A1 | 9/2014 | Rabkin | |
| 2014/0252532 A1 | 9/2014 | Yang et al. | |
| 2014/0328128 A1 | 11/2014 | Louie et al. | |
| 2014/0340952 A1 | 11/2014 | Ramaswamy et al. | |
| 2015/0079743 A1 | 3/2015 | Pachamuthu et al. | |
| 2015/0079744 A1 | 3/2015 | Hwang | |
| 2015/0129955 A1 | 5/2015 | Mueller et al. | |
| 2015/0187823 A1 | 7/2015 | Miyairi et al. | |
| 2015/0194440 A1 | 7/2015 | Noh et al. | |
| 2015/0206886 A1 | 7/2015 | Guha et al. | |
| 2015/0249143 A1 | 9/2015 | Sano | |
| 2015/0340371 A1 | 11/2015 | Lui | |
| 2016/0049404 A1 | 2/2016 | Mariani et al. | |
| 2016/0086953 A1 | 3/2016 | Liu | |
| 2016/0086970 A1 | 3/2016 | Peng | |
| 2016/0141294 A1 | 5/2016 | Peri et al. | |
| 2016/0225860 A1 | 8/2016 | Karda et al. | |
| 2016/0314042 A1 | 10/2016 | Plants | |
| 2017/0053906 A1 | 2/2017 | Or-Bach et al. | |
| 2017/0092370 A1 | 3/2017 | Harari | |
| 2017/0092371 A1 | 3/2017 | Harari | |
| 2017/0148517 A1 | 5/2017 | Harari | |
| 2017/0148810 A1 | 5/2017 | Kai et al. | |
| 2017/0358594 A1 | 12/2017 | Lu et al. | |
| 2018/0108416 A1 | 4/2018 | Harari | |
| 2018/0151419 A1 | 5/2018 | Wu et al. | |
| 2018/0269229 A1 | 9/2018 | Or-Bach et al. | |
| 2018/0286918 A1 | 10/2018 | Bandyopadhyay et al. | |
| 2018/0330791 A1 | 11/2018 | Li et al. | |
| 2018/0342455 A1 * | 11/2018 | Nosho | H01L 23/53238 |
| 2018/0342544 A1 | 11/2018 | Lee et al. | |
| 2018/0366471 A1 | 12/2018 | Harari et al. | |
| 2018/0366485 A1 | 12/2018 | Harari | |
| 2018/0366489 A1 | 12/2018 | Harari et al. | |
| 2019/0006009 A1 | 1/2019 | Harari | |
| 2019/0019564 A1 | 1/2019 | Li et al. | |
| 2019/0148286 A1 | 5/2019 | Or-Bach et al. | |
| 2019/0157296 A1 | 5/2019 | Harari et al. | |
| 2019/0180821 A1 | 6/2019 | Harari | |
| 2019/0206890 A1 | 7/2019 | Harari et al. | |
| 2019/0244971 A1 | 8/2019 | Harari | |
| 2019/0259769 A1 | 8/2019 | Karda et al. | |
| 2019/0304988 A1 | 10/2019 | Dong et al. | |
| 2019/0325964 A1 | 10/2019 | Harari | |
| 2019/0319044 A1 | 11/2019 | Harari | |
| 2019/0348424 A1 | 11/2019 | Karda et al. | |
| 2019/0355747 A1 | 11/2019 | Herner et al. | |
| 2019/0370117 A1 | 12/2019 | Fruchtman et al. | |

(56) References Cited

U.S. PATENT DOCUMENTS

| | | | |
|---|---|---|---|
| 2020/0020718 A1* | 1/2020 | Harari | H01L 21/02532 |
| 2020/0051990 A1 | 2/2020 | Harari et al. | |
| 2020/0063263 A1 | 2/2020 | Yang et al. | |
| 2020/0098738 A1 | 3/2020 | Herner et al. | |
| 2020/0098779 A1 | 3/2020 | Cernea et al. | |
| 2020/0176468 A1 | 6/2020 | Herner et al. | |
| 2020/0203378 A1* | 6/2020 | Harari | H01L 21/76843 |
| 2020/0219572 A1* | 7/2020 | Harari | H01L 29/7926 |
| 2020/0258897 A1 | 8/2020 | Yan et al. | |
| 2021/0175251 A1 | 6/2021 | Zhang et al. | |
| 2022/0028876 A1 | 1/2022 | Purayath et al. | |
| 2022/0028886 A1 | 1/2022 | Pur et al. | |

OTHER PUBLICATIONS

"PCT Search Report and Written Opinion, PCT/US2021/042607", dated Nov. 4, 2021, 17 pages.
"EP Extended Search Report EP168690149.3", dated Oct. 18, 2019.
"European Search Report, EP 16852238.1", dated Mar. 28, 2019.
"European Search Report, EP17844550.8", dated Aug. 12, 2020, 11 pages.
"Notification of Reasons for Refusal, Japanese Patent Application 2018-527740", (English translation), dated Nov. 4, 2020, 8 pages.
"Partial European Search Report EP 16869049.3", dated Jul. 1, 2019, pp. 1-12.
"PCT Search Report and Written Opinion, PCT/US2018/038373", dated Sep. 10, 2018.
"PCT Search Report and Written Opinion, PCT/US2018/067338", dated May 8, 2019.
"PCT Search Report and Written Opinion, PCT/US2019/014319", dated Apr. 15, 2019.
"PCT Search Report and Written Opinion, PCT/US2019/041678", dated Oct. 9, 2019.
"PCT Search Report and Written Opinion, PCT/US2019/052446", dated Dec. 11, 2019.
"PCT Search Report and Written Opinion, PCT/US2020/065670", dated Apr. 5, 2021, 12 pages.
Kim, N., et al., "Multi-layered Vertical gate NANO Flash Overcoming Stacking Limit for Terabit Density Storage", Symposium on VLSI Tech. Dig. of Technical Papers, 2009, pp. 188-189.
Lue, H.T., et al., "A Highly Scalable 8-Layer 3D Vertical-gate {VG} TFT NANO Flash Using Junction-Free Buried Channel BE-SONOS Device", Symposium on VLSI: Tech. Dig. of Technical Papers, 2010, pp. 131-132.
Tanaka, T., et al., "A 768 GB 3b/cell 3D-Floaling-Gate NANO Flash Memory", Digest of Technical Papers, the 2016 EEE International Solid-Slate Circuits Conference, 2016, pp. 142-144.
Wann, H.C., et al., "High-Endurance Ultra-Thin Tunnel Oxide in Monos Device Structure for Dynamic Memory Application", IEEE Electron Device letters, vol. 16, No. 11, Nov. 1995, pp. 491-493.
Wu, Jixuan, et al., "A Monolithic 3D Integration of RRAM Array with Oxide Semiconductor FET for In-Memory Computing in Quantized Neural Network AI Applications", 2020 IEEE Symposium on VLSI Technology Digest of Technical Papers, Honolulu, HI, USA, Jun. 2020, 4 pages.

* cited by examiner

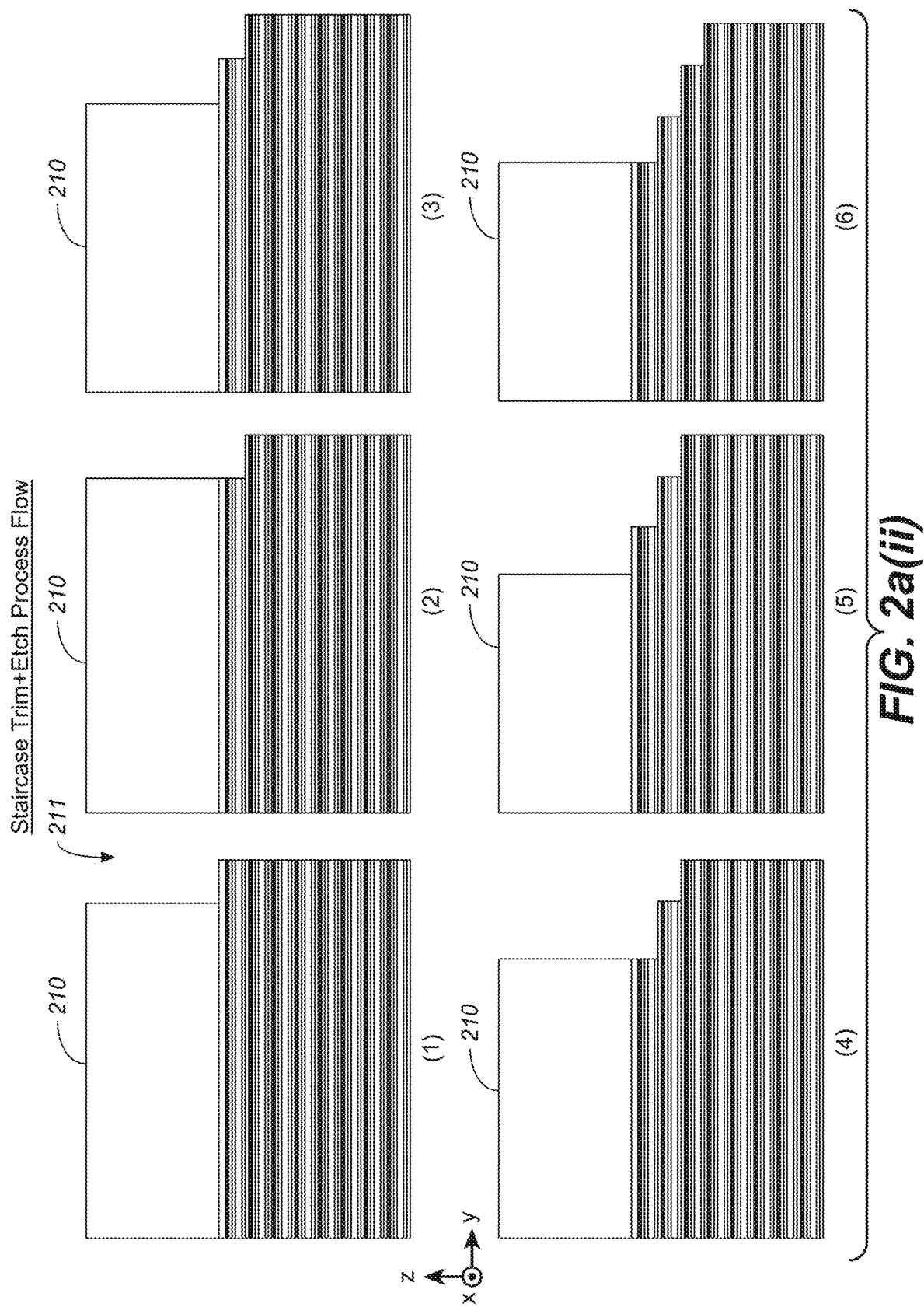

METHODS FOR FABRICATING A 3-DIMENSIONAL MEMORY STRUCTURE OF NOR MEMORY STRINGS

CROSS REFERENCE TO RELATED APPLICATIONS

This present application relates to and claims priority of U.S. provisional patent application ("Related Application I"), Ser. No. 63/054,750, entitled "Methods for Fabricating a 3-Dimensional Memory Structure of NOR Memory Strings," filed on Jul. 21, 2020.

The present application is also related to (i) U.S. patent application ("Related Application II"), Ser. No. 16/510,610, entitled "Fabrication Method For a 3-Dimensional NOR Memory Array," filed on Jul. 12, 2019; (ii) U.S. patent application ("related Application III"), Ser. No. 16/894,624, entitled "3-Dimensional NOR Memory Array With Very Fine Pitch: Device and Method," filed Jun. 5, 2020; and (iii) U.S. provisional patent application ("Related Application IV"), Ser. No. 62/950,390, entitled "Process For Preparing A Channel Region Of A Thin-Film Transistor In A 3-Dimensional Thin-Film Transistor Array," filed on Dec. 19, 2019.

The disclosures of Related Applications I-IV (collectively, the "Related Applications") are hereby incorporated by reference in their entireties.

BACKGROUND OF THE INVENTION

1. Field of the Invention

The present invention relates to processes for manufacturing memory integrated circuits. In particular, the present invention relates to processes for fabricating thin-film storage transistors in a 3-dimensional memory structure formed on a planar surface of a semiconductor substrate.

2. Discussion of the Related Art

High density memory arrays, e.g., 3-dimensional arrays of NOR memory strings ("3-D NOR memory arrays"), have been disclosed in, for example, U.S. Patent Application Publication 2017/0092371A1 ("Structural Reference I"), entitled "Capacitive-Coupled Non-Volatile Thin-film Transistor Strings in Three-Dimensional Arrays," and U.S. Patent Application Publication 2018/0366489A1 ("Structural Reference II"), entitled "3-Dimensional NOR Memory Array Architecture and Methods for Fabrication Thereof." The disclosures of Structural References I and II (collectively, "Structural References") are hereby incorporated by reference in their entireties. In addition to providing high memory density and capacity, these 3-D NOR memory arrays may be operated to provide memory circuits at highly desirable speeds that rival conventional memory circuits of much lower circuit densities and significantly higher power dissipation, e.g., as dynamic random-access memories ("DRAMs").

In some examples in the Structural References, a 3-D NOR memory array includes numerous stacks of NOR memory strings, with each stack having numerous NOR memory strings stacked one on top of another. In that context, a NOR memory string includes numerous storage cells that share a common drain region ("common bit line") and a common source region ("common source line"), the storage cells being provided on one or both sides along the length of the NOR memory string. Each storage cell is controlled by a conductor ("word line" or "local word line") that runs substantially orthogonal to the memory string. Each word line may be shared by numerous storage cells in different NOR memory strings along its length and on opposite sides of the word line. However, to achieve high density in the 3-D NOR memory array requires a fine pitch between adjacent word lines. Etching conductors (e.g., tungsten) at a high aspect ratio (e.g., 50 or greater) is a challenging task.

SUMMARY

According to one embodiment of the present invention, a process that creates a NOR memory array with word lines that are separated by a very fine pitch include (i) providing over a planar surface of a semiconductor substrate first and second semiconductor structures separated by a trench having a predetermined width along a first direction that is substantially parallel the planar surface, each semiconductor structure may include multi-layer active strips each extending lengthwise along a second direction that is substantially orthogonal to the first direction, and which are stacked one on top of another along a third direction that is substantially normal to the planar surface, adjacent multi-layer active strips being electrically isolated from each other by a layer of an isolation material, wherein each active multi-layer strip may include first and second semiconductor layers of a first conductivity type separated by a dielectric material; (ii) recessing the sidewalls of the trench at the multi-layer strips along the first direction, thereby creating recesses between two layers of isolation material; (iii) providing in the recesses a predetermined material; (iv) filling the trench with a first filler material; (v) forming first and second shafts at a predetermined distance along the second direction by removing in each shaft a portion of each multi-layer strip from each of the first and second semiconductor structures and a portion of the second isolation material in the trench; (vi) filling the first and second shafts with a second filler material; (vii) removing the first filler material from the trench between the first and second shafts; and (viii) providing a charge-trapping layer conformally on the sidewalls of the trench and filling the remainder of the trench with a conductive material.

The first and second semiconductor layers of each multi-layer active strip, the charge-trapping layer, the conductive material may provide, respectively, a common bit line, a common source line, a charge storage layer and a gate electrode of a thin-film storage transistor in a NOR memory string. In one embodiment, the predetermined material may be a channel polysilicon material that serves as a channel region for a thin-film storage transistor. In another embodiment, the predetermined material is replaced after the word lines are formed to the final channel material, which may be sealed with a dielectric liner (e.g., an atomic layer deposition (ALD) silicon oxide liner).

The present invention avoids the challenge of etching a conductor material that is aimed at providing the local word lines at the fine pitch. Etching of the shafts that provide isolation between the thin-film storage transistors may proceed at a lower aspect ratio than would be required for etching the conductor material.

In one embodiment of the present invention, the first and second semiconductor layers may include $N^+$-doped amorphous silicon or polysilicon, the third semiconductor layer may include $P^-$-doped amorphous or polysilicon, the isolation material may include silicon oxycarbide (SiOC) or silicon oxide, and the charge-trapping layer may include (i) a tunneling layer (e.g., any silicon oxide ($SiO_x$), silicon nitride (SiN), silicon oxynitride (SiON), any aluminum oxide (AlO$_x$), any hafnium oxide (HfO$_x$), zirconium oxide (ZrO$_x$), any hafnium silicon oxide (HfSi$_x$O$_y$), any hafnium zirconium oxide (HfZrO), or any combination thereof); (ii) a charge storage layer (e.g., silicon nitride (SiN), hafnium oxide (HfO$_2$), or hafnium silicon oxynitride (HfSiON)) and a blocking layer (e.g., any silicon oxide, aluminum oxide, or both). The conductive material may include a metal liner (e.g., titanium (Ti), titanium nitride (TiN), tantalum (Ta) or tantalum nitride (TaN)) and a refractory metal (e.g., tungsten (W), tungsten nitride (WN) or molybdenum (Mo)). The first filler material may include silicon oxide.

According to one embodiment of the present invention a cap (e.g., tungsten) may be provided to protect the charge-trapping layer and the local word line from subsequent process steps after they are formed. The shafts may be lined with a dielectric liner (e.g., silicon nitride) prior to filling by the second filler material (e.g., silicon oxide).

The present invention is better understood upon consideration of the detailed description below in conjunction with the accompanying drawings.

BRIEF DESCRIPTION OF THE DRAWINGS

FIG. 2a(ii) illustrates successive recessing and etching steps to create staircase portion 102a or 102b of FIG. 1, in accordance with one embodiment of the present invention.

FIGS. 2l(i) and 2l(ii) show, respectively, a top view and a cross section view (in an X-Z plane along line A-A' of FIG. 2l(i)) of resulting memory structure 200, after silicon oxide 223 is removed from trenches 218, according to one embodiment of the present invention.

DETAILED DESCRIPTION OF THE PREFERRED EMBODIMENTS

Figure 1:
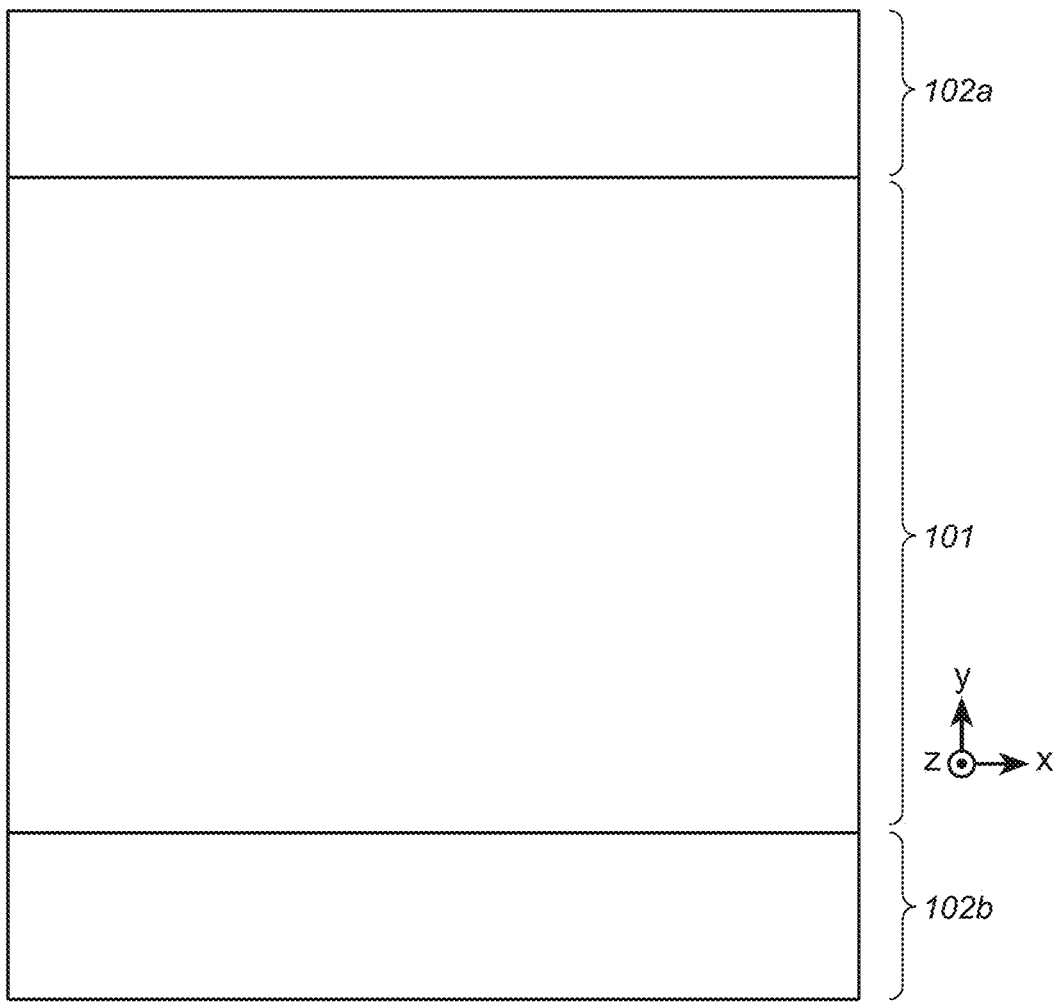
FIG. 1 is a schematic top view of modular unit ("tile") 100 in a memory structure that includes 3-D NOR memory arrays, in accordance with one embodiment of the present invention.

FIG. 1 is a schematic top view of modular unit ("tile") 100 in a memory structure that includes 3-D NOR memory arrays, in accordance with one embodiment of the present invention. Tile 100 is typically formed on a planar surface of a semiconductor substrate, such as a monocrystalline epitaxial layer of a silicon wafer. In this detailed description, to facilitate visualization of the 3-dimensional structures, a rectilinear coordinate reference frame is used, which postulates the planar surface on an X-Y plane, and a normal of the planar surface in the Z-direction orthogonal to the X-Y plane.

In some examples, the semiconductor substrate may include support circuitry for the 3-D NOR memory arrays formed therein or thereon underneath the 3-D NOR memory arrays. Such support circuits may include both analog and digital circuits. Some examples of such support circuits include shift registers, latches, sense amplifiers, reference cells, power supply lines, bias and reference voltage generators, inverters, NAND, NOR, Exclusive-Or and other logic gates, input/output drivers, address decoders (e.g., bit line and word line decoders), other memory elements, data encoding and decoding circuits including, for example, error detection and correction circuits), sequencers and state machines. This detailed description begins with a semiconductor substrate in which such support circuits, if any, have already been formed in a conventional manner. This detailed description and the skill of those of ordinary skill in the art inform any constraints or relevant design options imposed or made available by the process or processes carried out in the formation of the support circuit of the semiconductor substrate on the various embodiments of the present invention, and vice versa.

As shown in FIG. 1, tile 100 includes "array" portion 101, which is provided between "staircase portions" 102a and 102b. The thin-film storage transistors of the NOR memory strings in tile 100 are formed in array portion 101 and staircase portions 102a and 102b allow connections through conductive vias to the common bit lines and, optionally, the common source lines also, of the NOR memory strings. (The Structural References disclose a scheme in which the common source lines are pre-charged to serve as virtual voltage reference source during programming, reading and erase operations, thereby obviating the need for a continuous electrical connection with the support circuitry during such operations.) In FIG. 1, array portion 101 and staircase portions 102a and 102b are not drawn to scale. For example, array portion 101 may be much larger in area than either of staircase portions 102a and 102b.

Figure 2A:
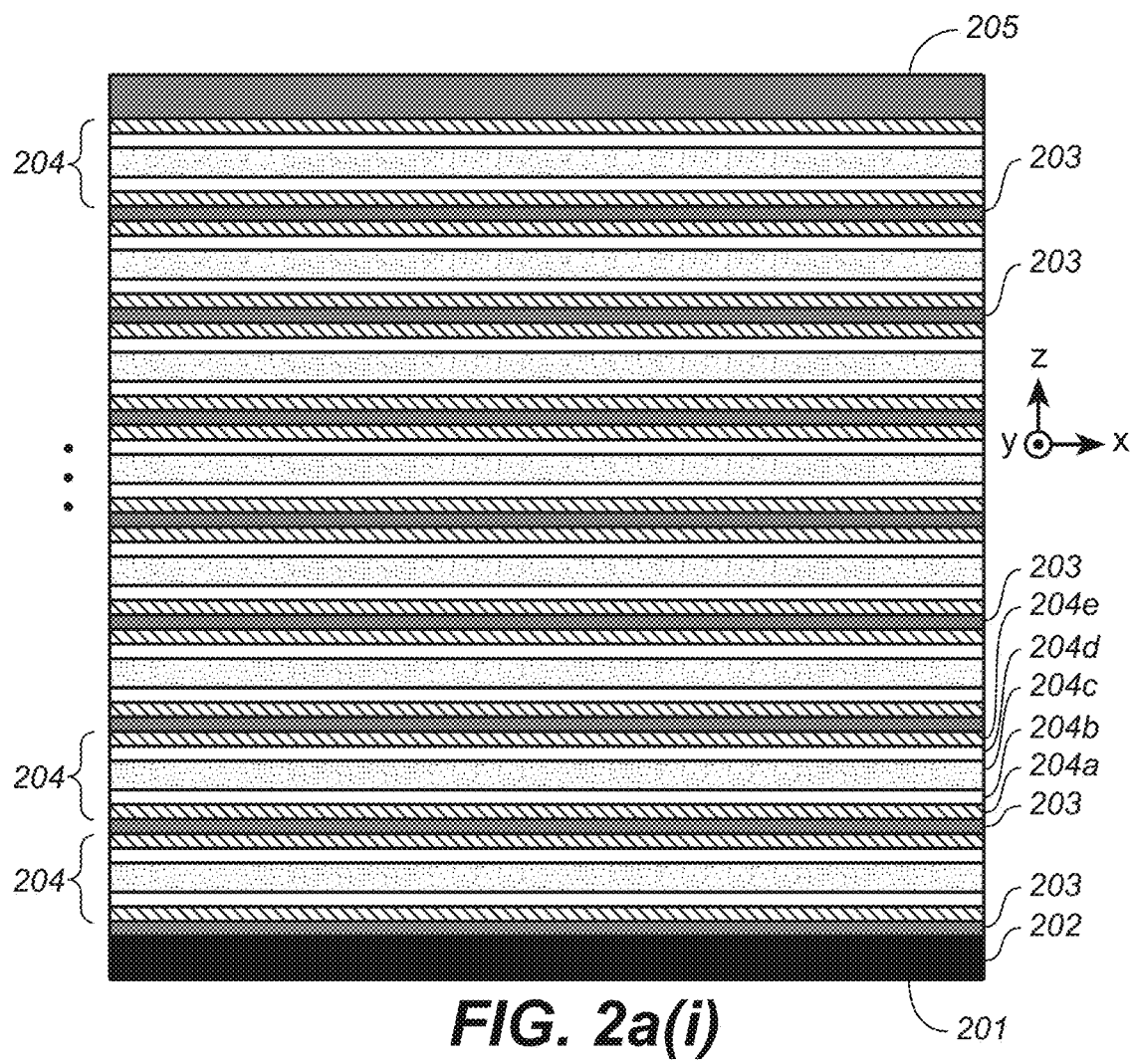
FIG. 2a(i) shows a cross section in the Z-X plane of memory structure 200 after depositions of numerous material layers (discussed below), in accordance with one embodiment of the present invention.
Figure 2B:
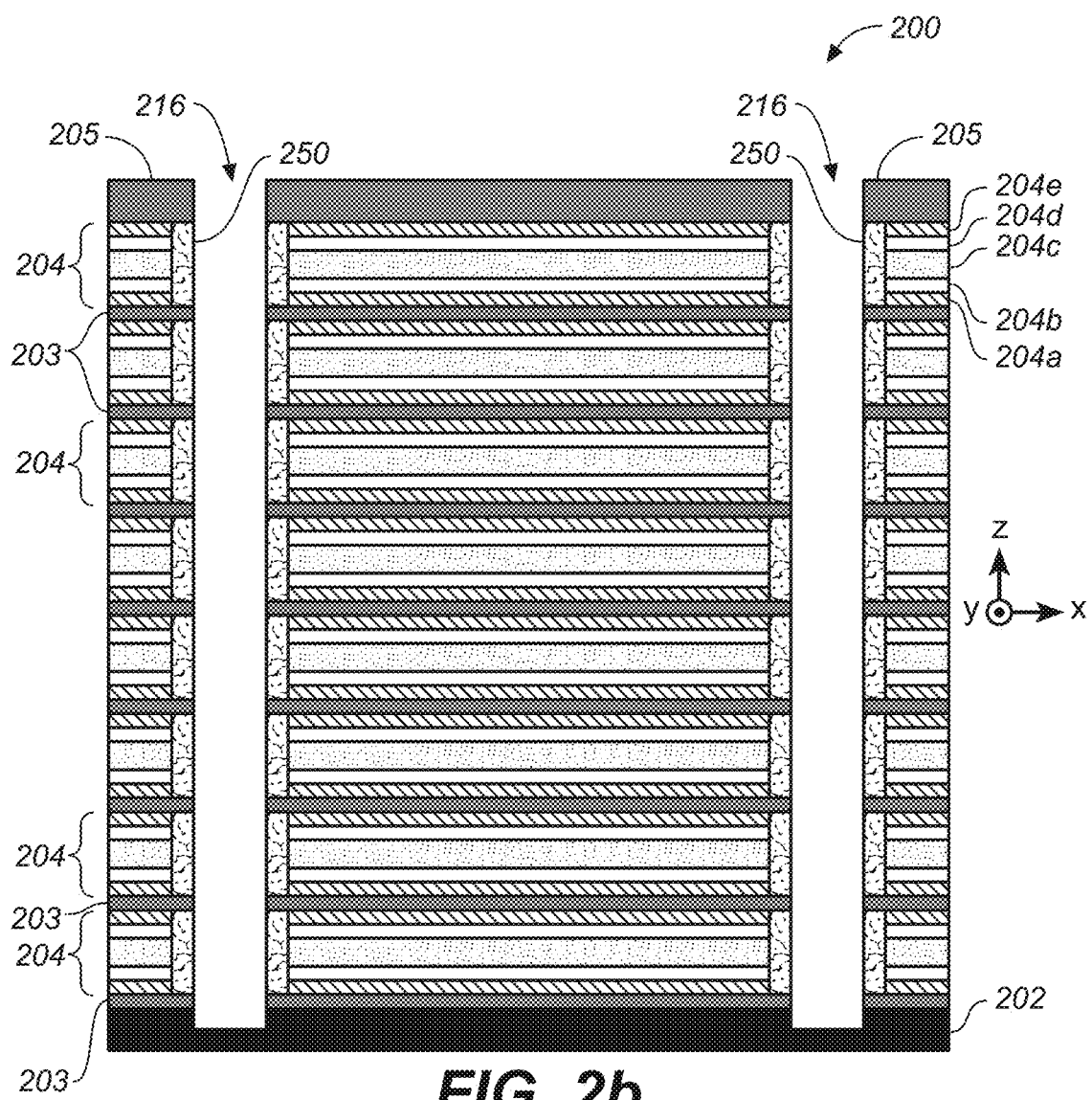
FIG. 2b shows resulting memory structure 200 in an X-Z plane cross section, after separation etch of P$^-$-doped amorphous silicon layer 250 is carried out, in accordance with one embodiment of the present invention.

FIG. 2a(i) shows a cross section in the Z-X plane of memory structure 200 after depositions of numerous material layers (discussed below), in accordance with one embodiment of the present invention. Initially, a pad oxide 201 (e.g., a silicon oxide) is provided over the planar surface of the semiconductor substrate. Etch stop layer 202 (e.g., tungsten (W), tungsten nitride (WN), aluminum oxide (AlO) or aluminum nitride (AlN)) is then provided. Silicon oxycarbide (SiOC) layer 203 is then provided to isolate etch stop layer 202 from the next layer to be deposited. Thereafter, active multi-layers 204 (eight in total, as shown in FIG. 2a(i)) are successively deposited. Active multi-layers 204 each include, in order of deposition, (i) silicon nitride (SiN) layer 204a, (ii) N+-doped amorphous silicon (or polysilicon) layer 204b, (iii) sacrificial oxide layer 204c, (iv) N+-doped amorphous silicon (or polysilicon) layer 204d, and (v) SiN layer 204e. Between adjacent active multi-layers is deposited a SiOC layer, indicated in FIG. 2a(i) as SiOC layer 203. Isolation SiOC layer 205 is then deposited on top of multi-layers 204. The resulting structure is memory structure 200 of FIG. 2.

FIG. 2a(ii) illustrates successive recessing and etching steps to create staircase portion 102a or 102b of FIG. 1, in accordance with one embodiment of the present invention. As shown in FIG. 2a(ii), the surface of memory structure 200 is patterned to form mask layer 210, exposing a first portion of memory structure 211, as shown in FIG. 2a(i)(1). The exposed portion of isolation SiOC layer 205 is then removed to expose a portion of active multi-layer 204 underneath. That exposed portion of active multi-layer 204 is then removed, exposing a portion of SiOC layer 203 underneath. The resulting structure is shown in FIG. 2a(ii)(2). Mask layer 210 is then recessed to expose a new portion of isolation SiOC layer 205. Removal of the exposed SiOC layers 205 and 203, removal of active multi-layer 204 and recessing mask layer 210 are then repeated 7 more times, thereby forming staircase structure 102a or 102b. Thereafter, an oxide is deposited to fill the portions of active layers 240 removed. A chemical-mechanical polishing (CMP) step is carried out to remove mask layer 210 and to planarize the top surface of memory structure 200. Conductor-filled vias may be created at a suitable subsequent time to provide connection to conductive layers in the active multi-layers 204.

This description describes formation of staircase structures 102a and 102b prior to describing in detail in the following processing of array portion 101. However, array portion 101 may also be processed prior to formation of staircase structures 102a and 102b.

At the beginning of processing array portion 101, a hard mask layer (e.g., carbon hard mask) is deposited and photolithographically patterned over memory structure 200. The hard mask transfers its pattern to allow etching first group of trenches 216 in memory structure 200. Each of trenches 216 extends through isolation layers 205 and 203, active multi-layers 204 and etch stop layer 202. In one embodiment, trenches 216 are each 70 nm wide, with corresponding edges of adjacent trenches separated 190 nm from each other. In that embodiment, trenches 216 are etched at an aspect ratio that is less than 50 (and even less than 30). A series of etching steps then recesses SiN layers 204a and 204e, N+ doped amorphous silicon layers 204b and 204d and oxide layer 204c of each active layer 204 by, for example, 10 nm. Thereafter, P−-doped amorphous silicon (or polysilicon) layer 250 is conformally deposited and etched back (i.e., a separation etch). N+ amorphous silicon layers 204b and 204d of each active multi-layer 204 would provide the common bit line and the common source line of the thin-film transistors of a NOR memory string to be formed. In one embodiment, P−-doped amorphous silicon layer 250 would provide channel regions for the storage transistors of the NOR memory string. The hard mask and excess P−-doped amorphous polysilicon layer 250 on top of memory structure 200 are then removed (e.g., by CMP). Resulting memory structure 200 is shown in an X-Z plane cross section in FIG. 2b, after separation etch of P−-doped amorphous silicon layer 250 is carried out, in accordance with one embodiment of the present invention.

Figure 2C:
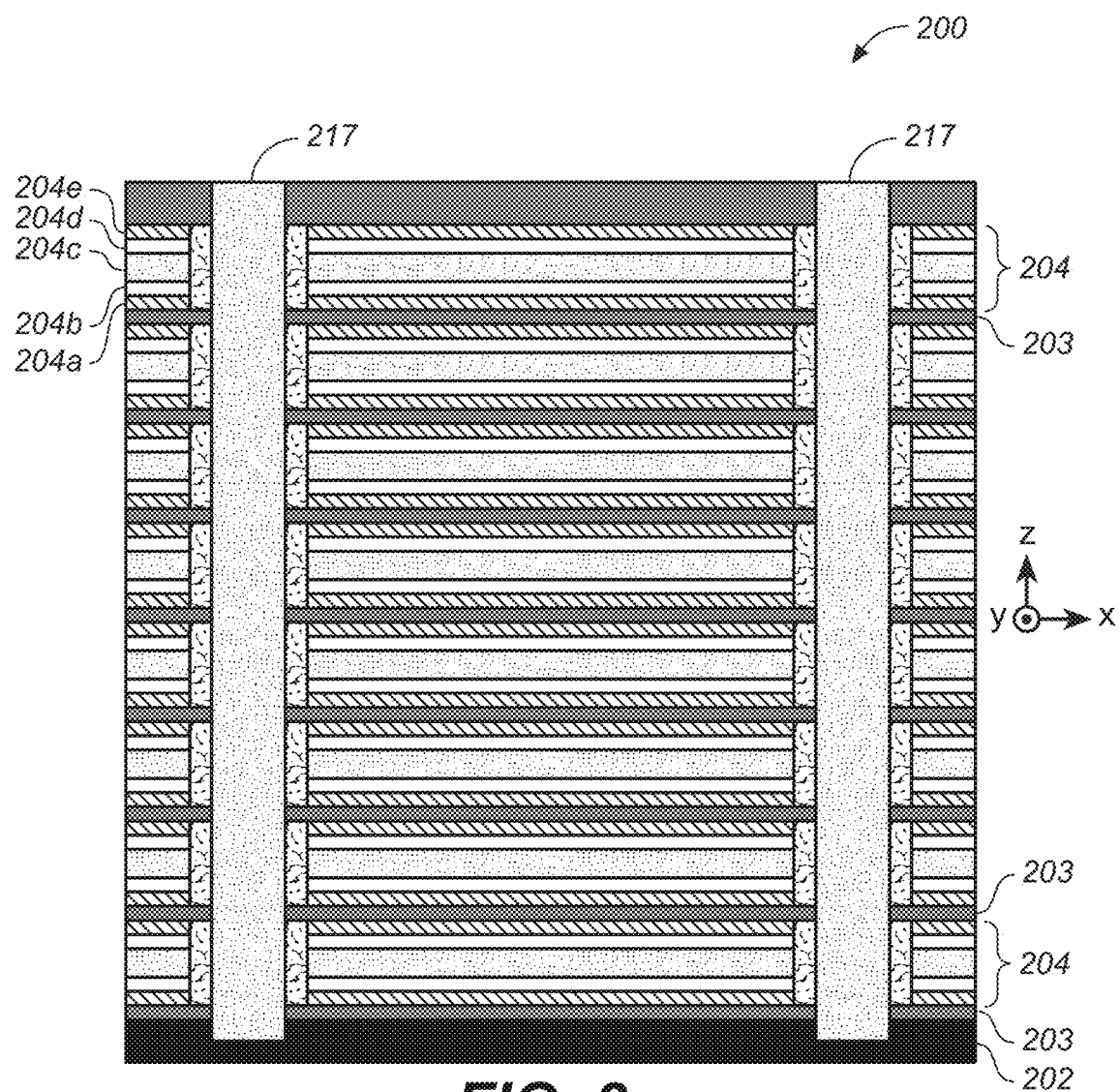
FIG. 2c shows resulting memory structure 200 in an X-Z plane cross section, after silicon oxide 223 is deposited to fill trenches 216 and planarized.

Thereafter, silicon oxide 223 is deposited to fill trenches 216, followed by removal of silicon oxide 223 on the top surface of semiconductor structure 200 and planarization (e.g., by CMP), as shown in an X-Z plane cross section in FIG. 2c.

Figure 2D:
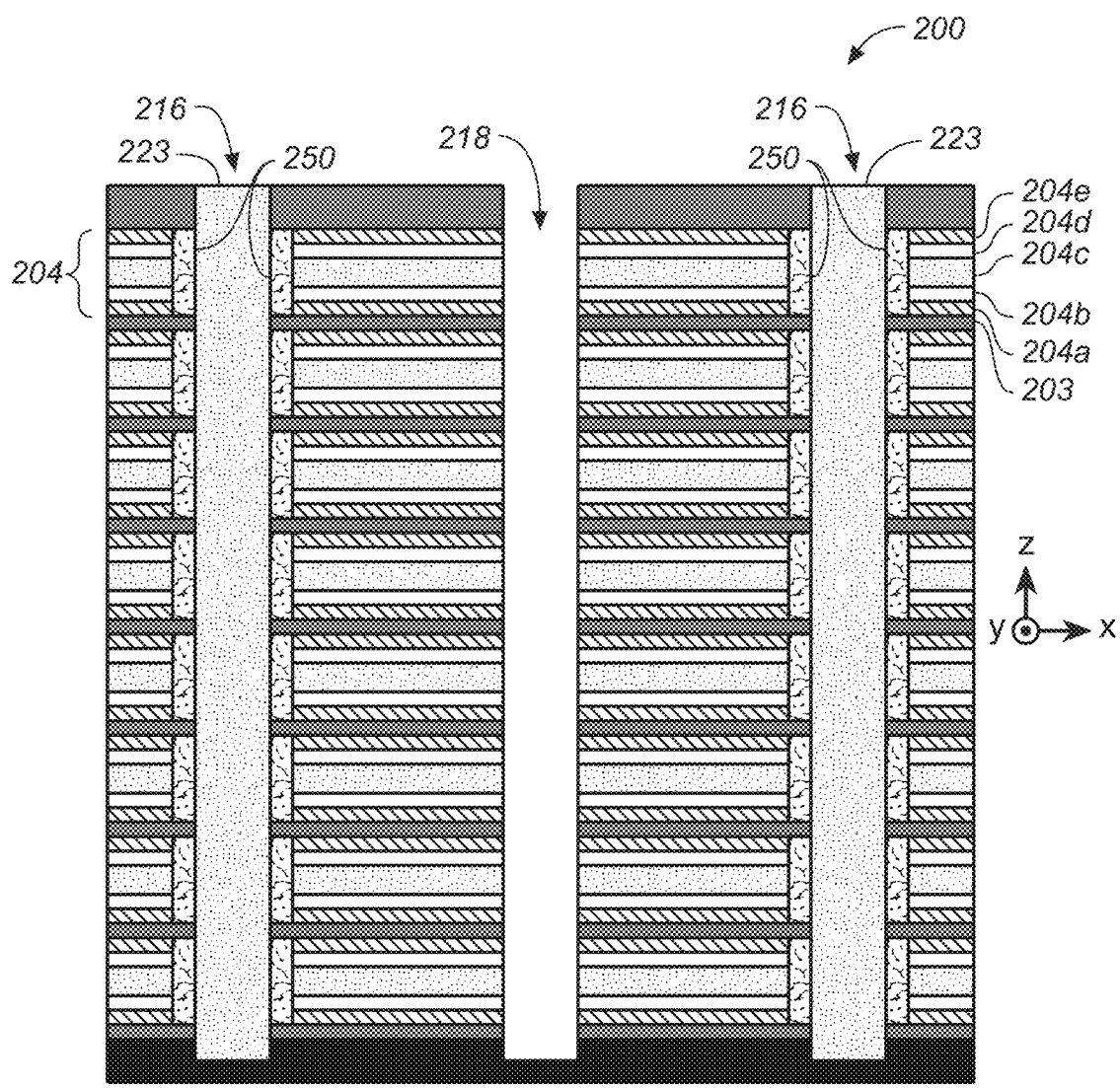
FIG. 2d shows resulting memory structure 200 in an X-Z plane cross section, after second group of trenches 218 are formed, according to one embodiment of the present invention.

Then, second group of trenches 218 are etched in substantially the same manner as trenches 216, as discussed above in conjunction with FIG. 2b. Second group of trenches 218 are created between adjacent ones of trenches 216. Since trenches 216 are oxide-filled, the material stacks between adjacent trenches have substantially the same pitch as in the etching of first group of trenches 216, thus providing mechanical support during etching of trenches 218. Trenches 218 are performed at substantially the same aspect ratio as etching of trenches 216. In this manner, forming the trenches in multiple groups allow each trench-forming etches to be performed within a desirable aspect ratio (e.g., less than 50). FIG. 2d shows resulting memory structure 200 in an X-Z plane cross section, after second group of trenches 218 are formed, according to one embodiment of the present invention.

Figure 2E:
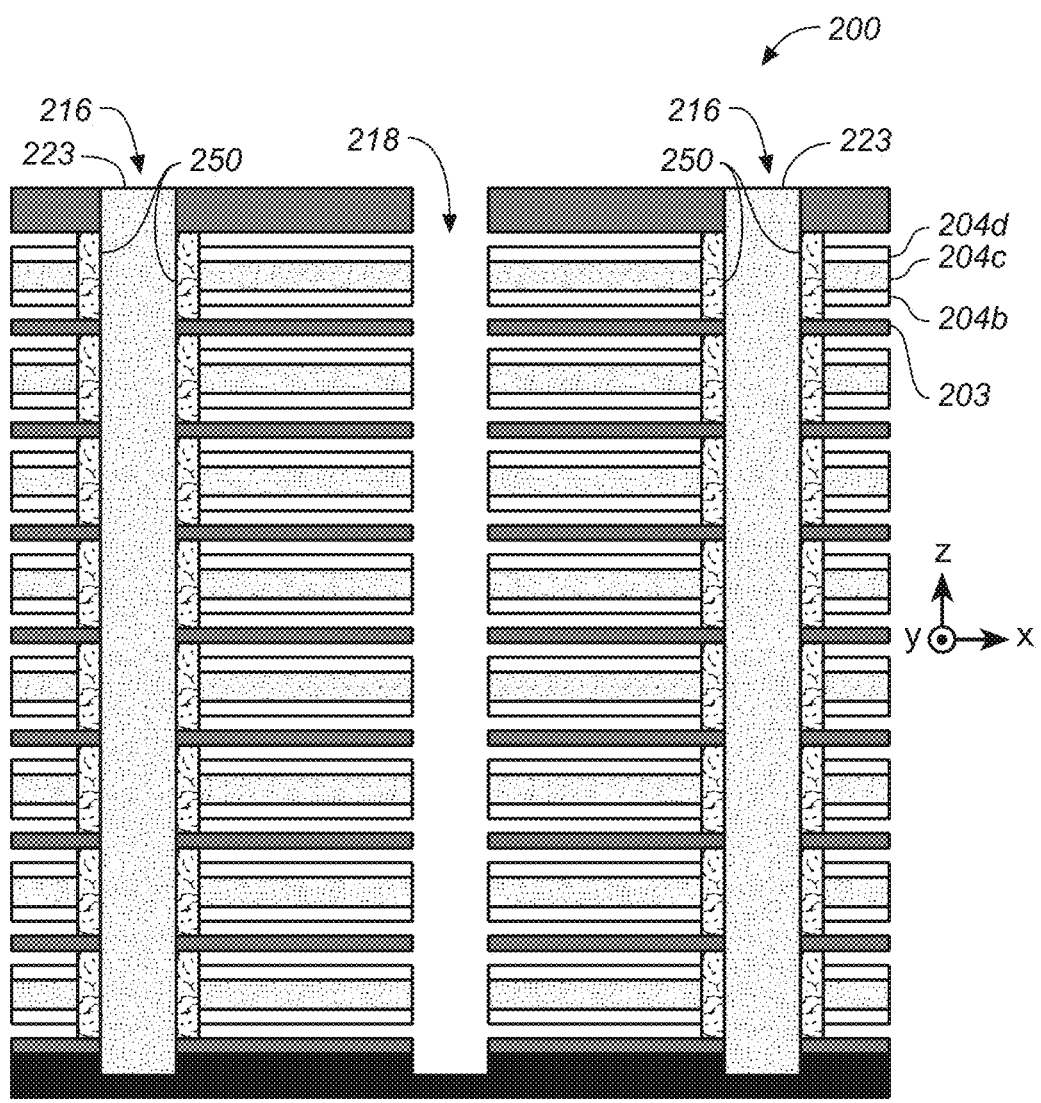
FIG. 2e shows resulting memory structure 200 in an X-Z plane cross section, after removal of SiN layers 204a and 204e from each active multi-layer 204, according to one embodiment of the present invention.

Through trenches 218, SiN layers 204a and 204e of each of active multi-layers 204 may be removed using, for example, a silicon nitride wet etch. FIG. 2e shows resulting memory structure 200 in an X-Z plane cross section, after removal of SiN layers 204a and 204e from each of active multi-layers 204, according to one embodiment of the present invention.

Figure 2F:
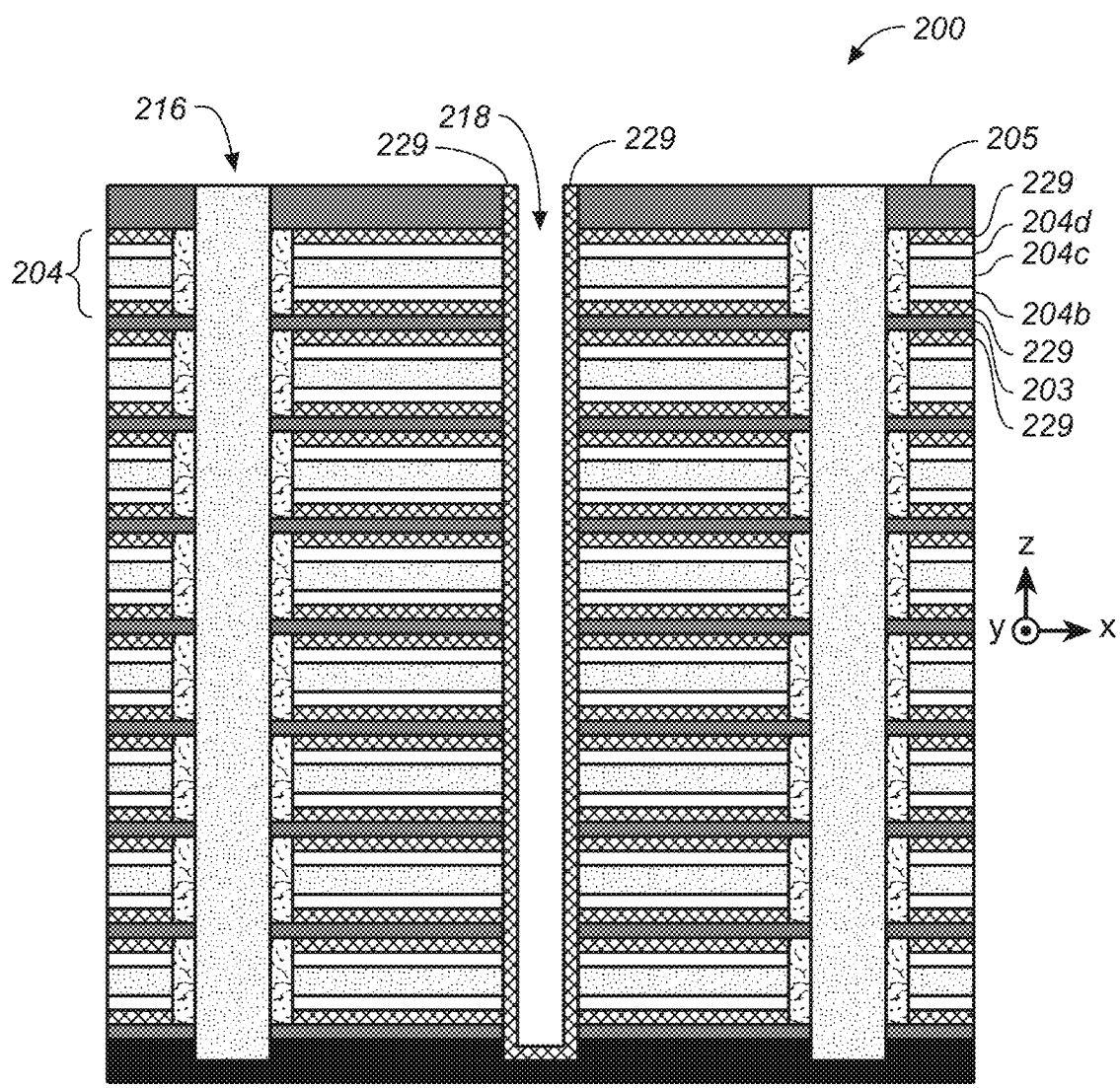
FIG. 2f shows resulting memory structure 200 in an X-Z plane cross section, after replacement of SiN layers 204a and 204e from each of active multi-layers 204 by conductive material 229, according to one embodiment of the present invention.

An atomic layer deposition (ALD) step deposits conductor material 229 (e.g., a liner of one or more of the following material—titanium, titanium nitride (TiN), tantalum (Ta), or tantalum nitride (TaN)—followed by a refractory metal (e.g., tungsten (W), tungsten nitride, or Molybdenum (Mo)) into the cavities resulting from removing SiN layers 204a and 204e from each of active multi-layers 204. Thereafter, an etch-back step or an anisotropic etch removes conductive material 229 from the bottom of trenches 218, leaving a substantially conformal layer on their sidewalls. FIG. 2f shows resulting memory structure 200 in an X-Z plane cross section, after replacement of SiN layers 204a and 204e from each of active multi-layers 204 by conductive material 229, according to one embodiment of the present invention.

Conductive material 229 form optional conductor layers in contact with $N^+$ amorphous silicon layers 204b and 204d. As $N^+$ amorphous silicon layers 204b and 204d of each active multi-layer 204 would become, respectively, the common bit line and the common source line of a NOR memory string to be formed, conductive material 229 reduces the resistivities in the common bit line and the common source line.

Figure 2G:
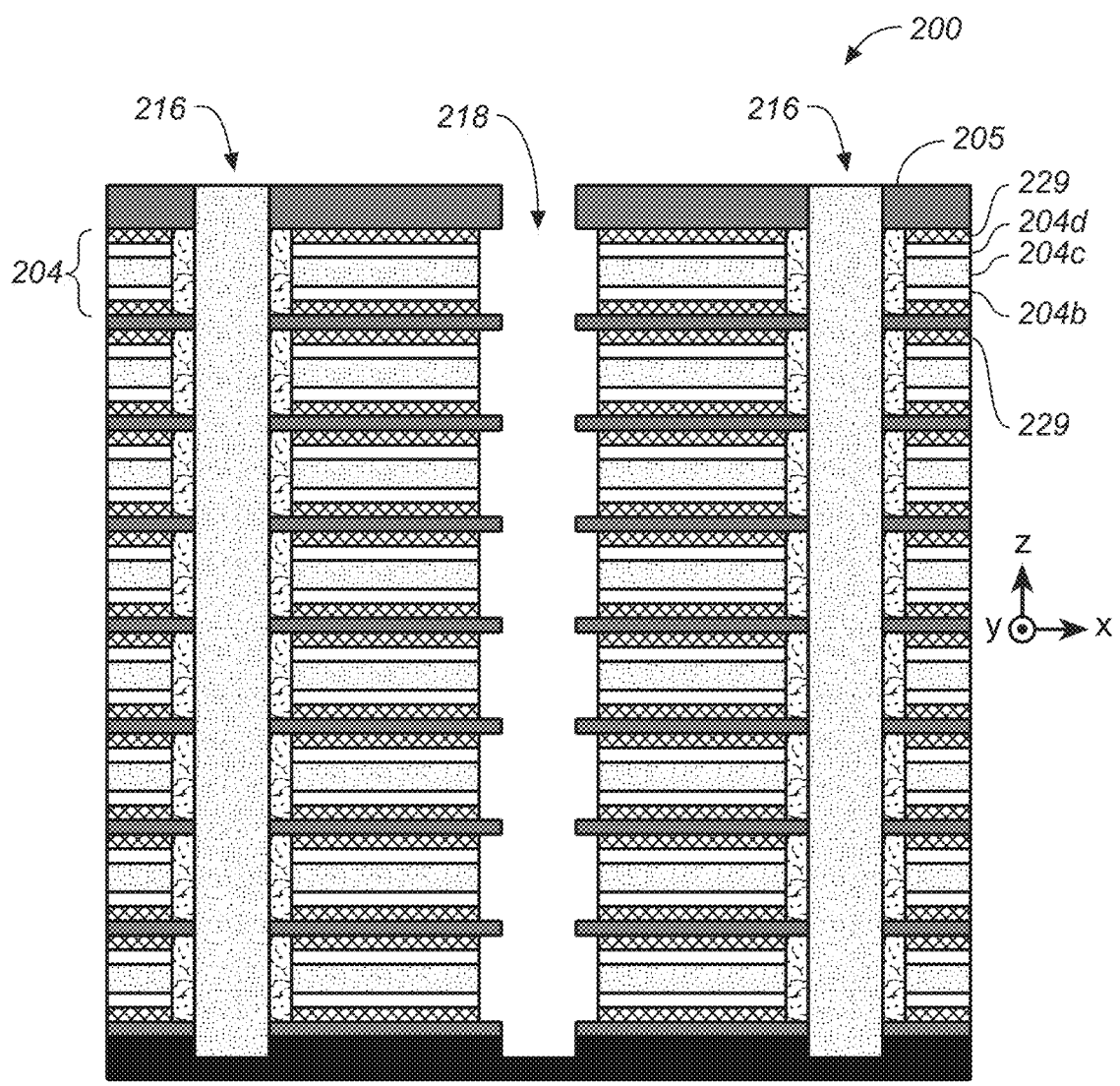
FIG. 2g shows resulting memory structure 200 in an X-Z cross section, after recessing conductive material 229, N$^+$ amorphous semiconductor layers 204b and 204d and oxide layer 203 of each active multi-layer 204, according to one embodiment of the present invention.

Conductive material 229 may be further etched to remove it from the sidewalls of trenches 218 and to be further recessed. A series of etching steps then recesses first and second $N^+$-doped amorphous silicon layers 204b and 204d, and oxide layer 204c of each active layer 204 by, for example, 10 nm. FIG. 2g shows resulting memory structure 200 in an X-Z cross section, after recessing conductive material 229, $N^+$ amorphous semiconductor layers 204b and 204d and oxide layer 203 of each active multi-layer 204, according to one embodiment of the present invention.

Figure 2H:
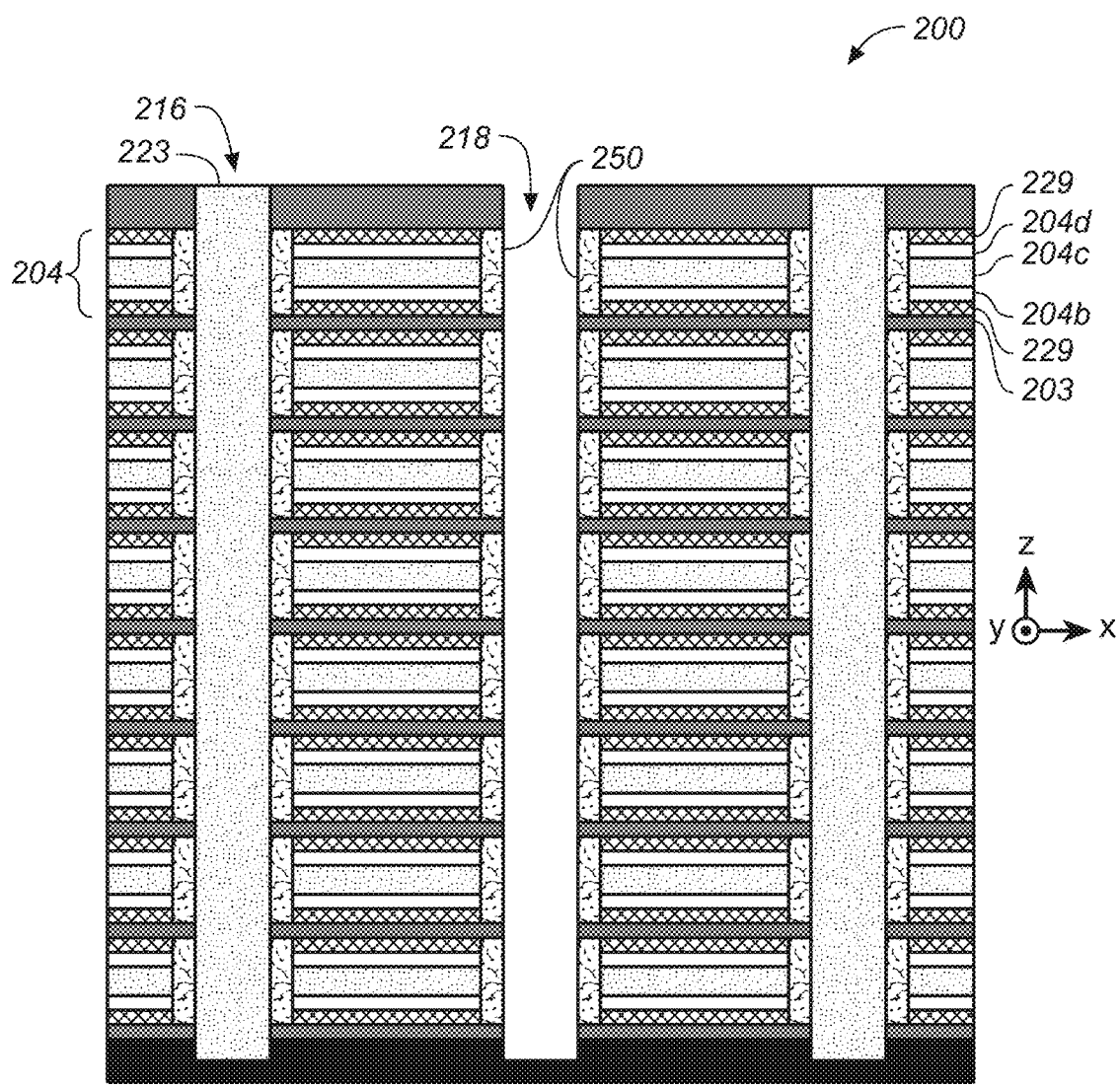
FIG. 2h shows resulting memory structure 200 in an X-Z cross section, after deposition of channel polysilicon 250 into trenches 218, according to one embodiment of the present invention.

Thereafter, $P^-$-doped amorphous silicon layer ("channel polysilicon") 250 may be conformally deposited on the sidewalls of trenches 218, in substantially the same manner as described above in conjunction with FIG. 2b. FIG. 2h shows resulting memory structure 200 in an X-Z cross section, after deposition of channel polysilicon 250 into trenches 218, according to one embodiment of the present invention.

Figure 2I:
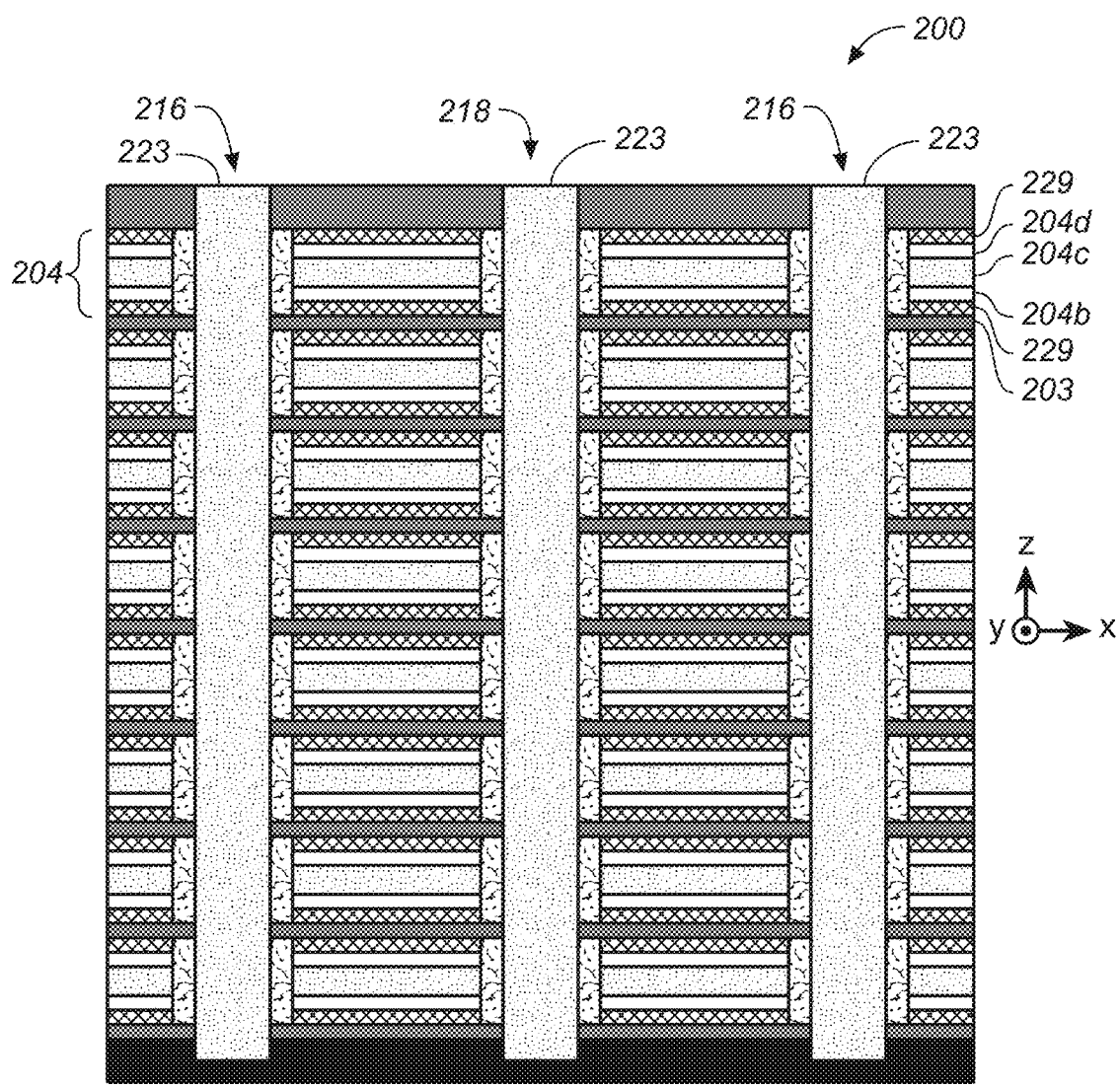
FIG. 2i shows resulting memory structure 200 in an X-Z cross section, after deposition of silicon oxide 223 into trenches 218, according to one embodiment of the present invention.

Trenches 218 may then be filled by silicon oxide 223 and planarized in the same manner as described above in conjunction with the steps for providing silicon oxide 223 of FIG. 2c. FIG. 2i shows resulting memory structure 200 in an X-Z cross section, after deposition of silicon oxide 223 into trenches 218, according to one embodiment of the present invention.

After silicon oxide 223 is deposited into trenches 218 and planarized, no further distinction between trenches 216 and 218 is necessary in the detailed description below. Therefore, hereinafter, trenches 216 and 218 are both referred to as trenches 218. The next steps provide the storage layer and the gate electrode ("word line" or "local word line") for each thin-film storage transistors of the NOR memory strings.

Figure 2J:
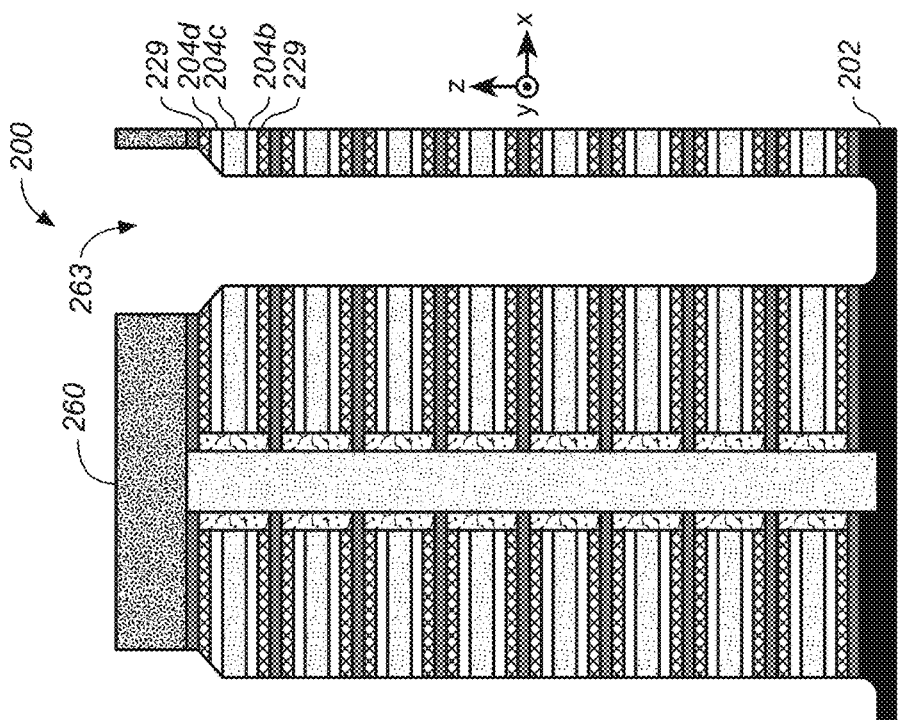
FIGS. 2j(i) and 2j(ii) show, respectively, a top view and a cross section view (in an X-Z plane along line A-A' of FIG. 2j(i)) of resulting memory structure 200, after shafts 263 are formed, according to one embodiment of the present invention.
Figure 2J:
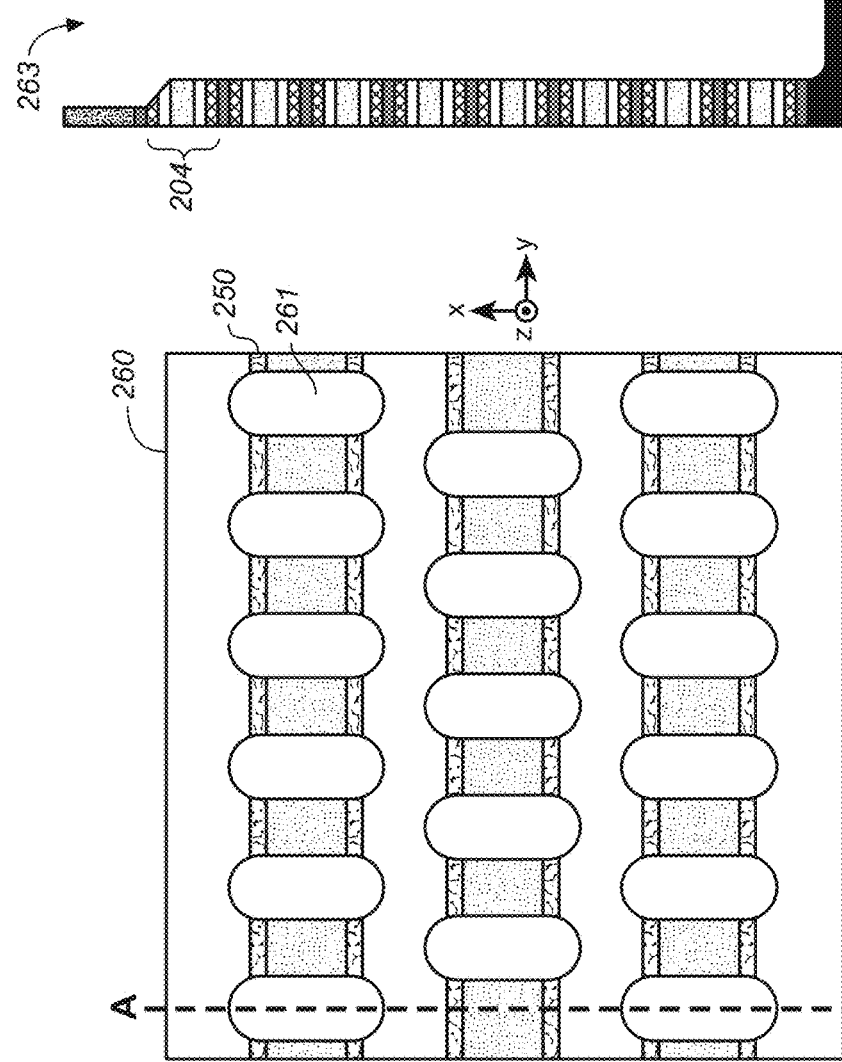

After planarization of silicon oxide 223, hard mask 260 is provided over memory structure 200, photolithographically patterned and developed. Hard mask 260 includes columns of oval openings 261. (In this description, a "column" of objects denotes objects aligned along the Y-direction, whereas a "row" of objects denotes objects aligned along the X-direction.) FIG. 2j(i), adjacent columns of openings 261 are staggered relative to each other along the X-direction, such that the closest openings in adjacent columns have a greater separation between them than if such openings are aligned in the X-direction. In one embodiment, adjacent openings within each column are located at a 110 nm pitch along the Y-direction, while adjacent columns are also provided at 110 nm pitch along the X-direction. In this embodiment, the major and minor axes of each opening may be 100 nm and 60 nm along the X-direction and the Y-direction, respectively, for example. A series of etchings through openings 261 excavates corresponding shaft 263, removing oxide layers 203 and active multi-layers 204 and reaching down to etch step layer 202. A top view and a cross section view (in an X-Z plane along line A-A' of FIG. 2j(i)) of resulting memory structure 200, after shafts 263 are formed, are shown in FIGS. 2j(i) and 2j(ii), respectively, according to one embodiment of the present invention. The aspect ratio of the etch steps creating shafts 263 have an aspect ratio that is still substantially within the desirable range (e.g., less than 50).

Figure 2K:
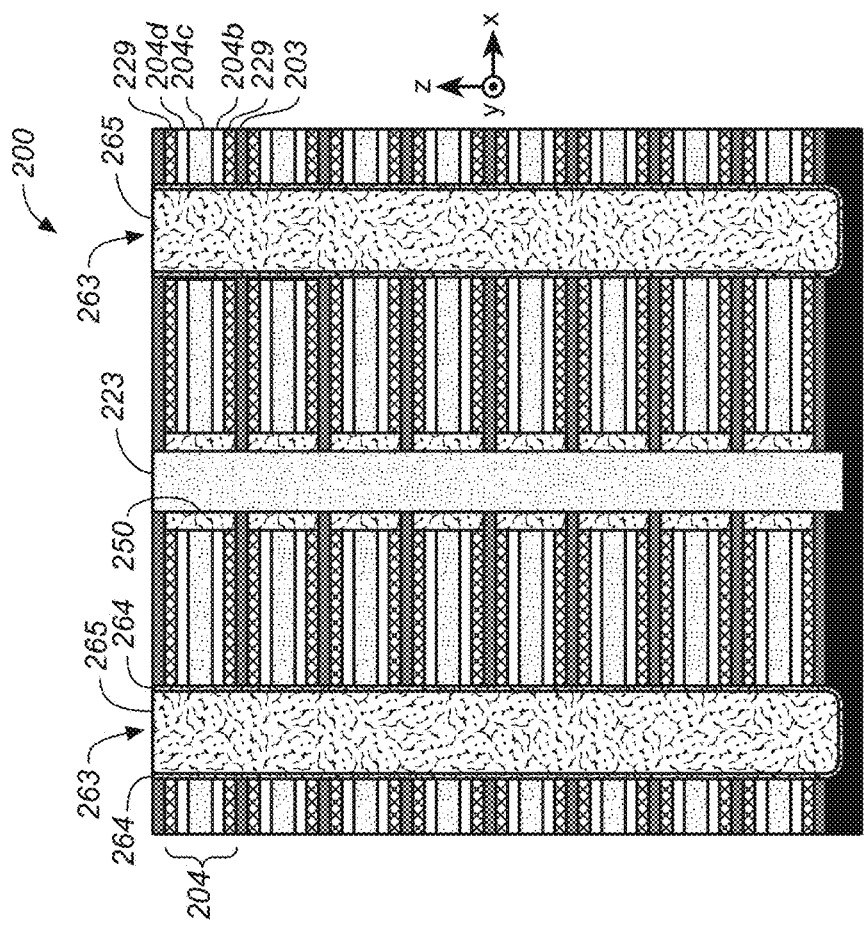
FIGS. 2k(i) and 2k(ii) show, respectively, a top view and a cross section view (in an X-Z plane along line A-A' of FIG. 2k(i)) of resulting memory structure 200, after shafts 263 are filled by sacrificial silicon 265, according to one embodiment of the present invention.
Figure 2K:
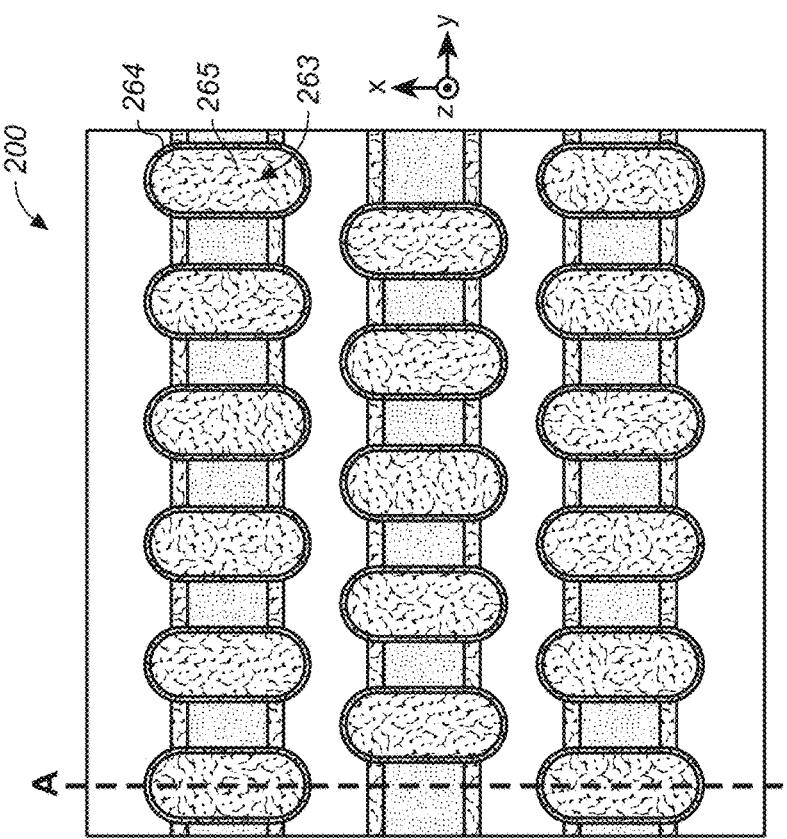
Figure 2I:
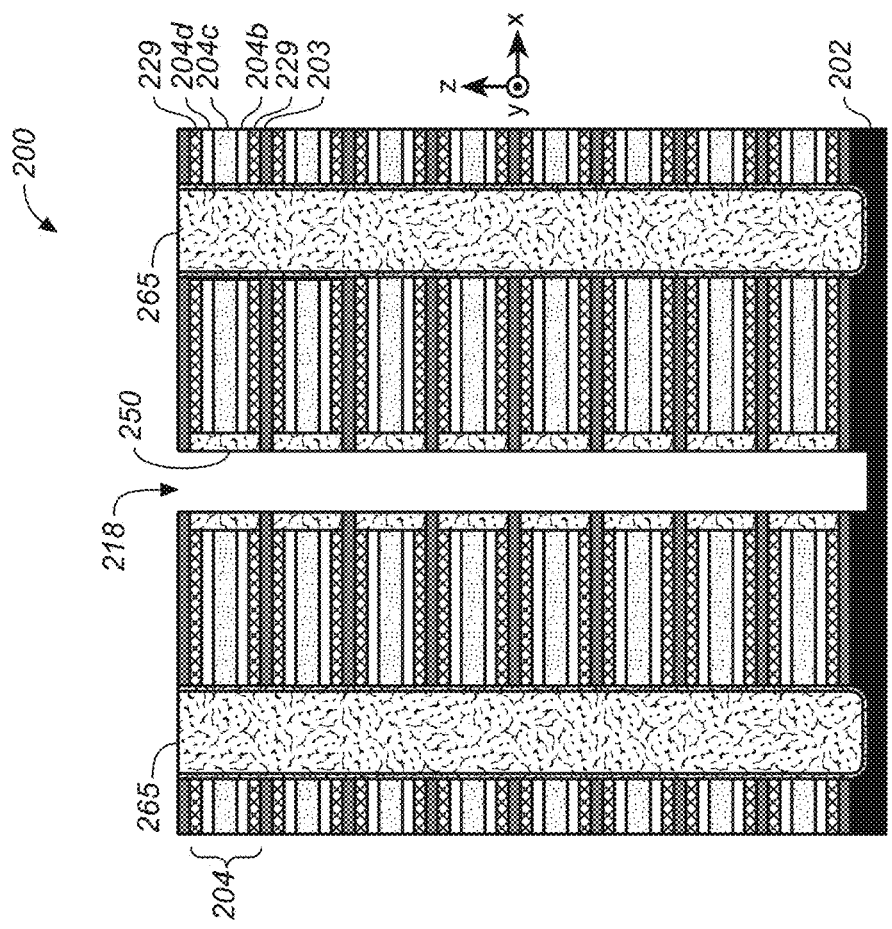
Figure 2I:
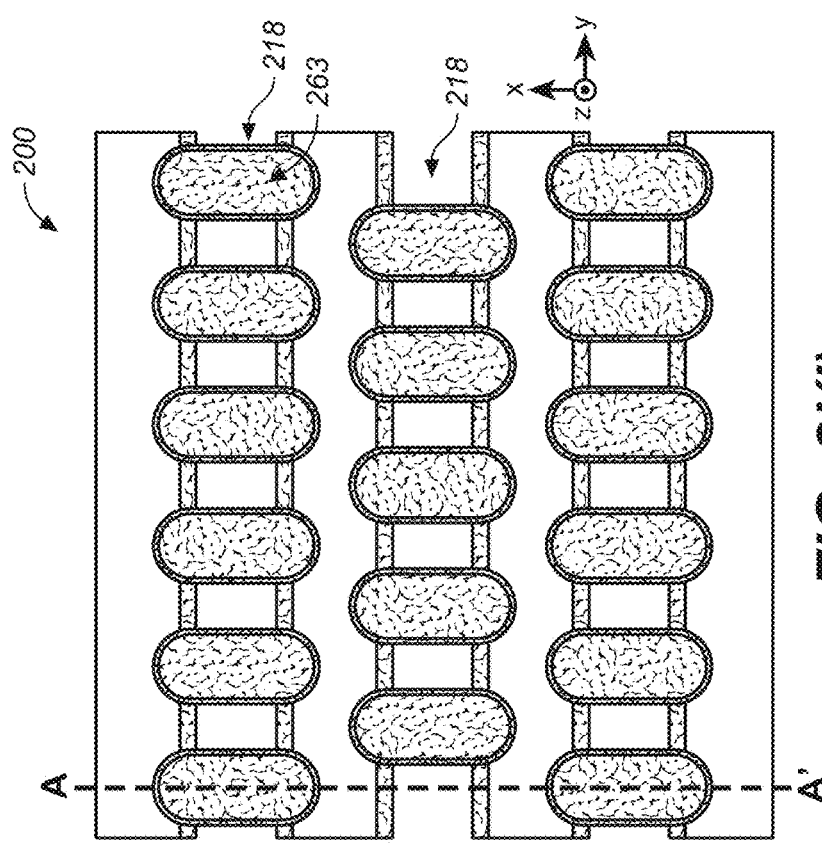

Next, silicon nitride liner 264 (e.g., 5 nm thick) is deposited conformally in shafts 263, which are then filled by sacrificial amorphous silicon 265. Hard mask 260 is then removed and the surface of memory structure 200 is planarized (e.g., by CMP). A top view and a cross section view (in an X-Z plane along line A-A' of FIG. 2k(i)) of resulting memory structure 200, after shafts 263 are filled by sacrificial amorphous silicon 265, are shown in FIGS. 2k(i) and 2k(ii), respectively, according to one embodiment of the present invention.

A wet etch then removes silicon oxide 223 from trenches 218. A top view and a cross section view (in an X-Z plane along line A-A' of FIG. 2l(i)) of resulting memory structure 200, after silicon oxide 223 is removed from trenches 218, are shown in FIGS. 2l(i) and 2l(ii), respectively, according to one embodiment of the present invention.

Thereafter, a conformal charge-trapping layer 268 is conformally deposited on the sidewalls of trenches 218. Charge-trapping layer 268 may be a multi-layer that includes:
 (i) a tunneling layer (e.g., any silicon oxide ($SiO_x$), silicon nitride (SiN), silicon oxynitride (SiON), any aluminum oxide ($AlO_x$), any hafnium oxide ($HfO_x$), zirconium oxide ($ZrO_x$), any hafnium silicon oxide ($HfSi_xO_y$), any hafnium zirconium oxide (HfZrO), or any combination thereof);
 (ii) a charge storage layer (e.g., silicon nitride (SiN), hafnium oxide ($HfO_2$), or hafnium silicon oxynitride (HfSiON)) and
 (iii) a blocking layer (e.g., any silicon oxide ($SiO_x$), any aluminum oxide ($AlO_x$), or both).

Figure 2M:
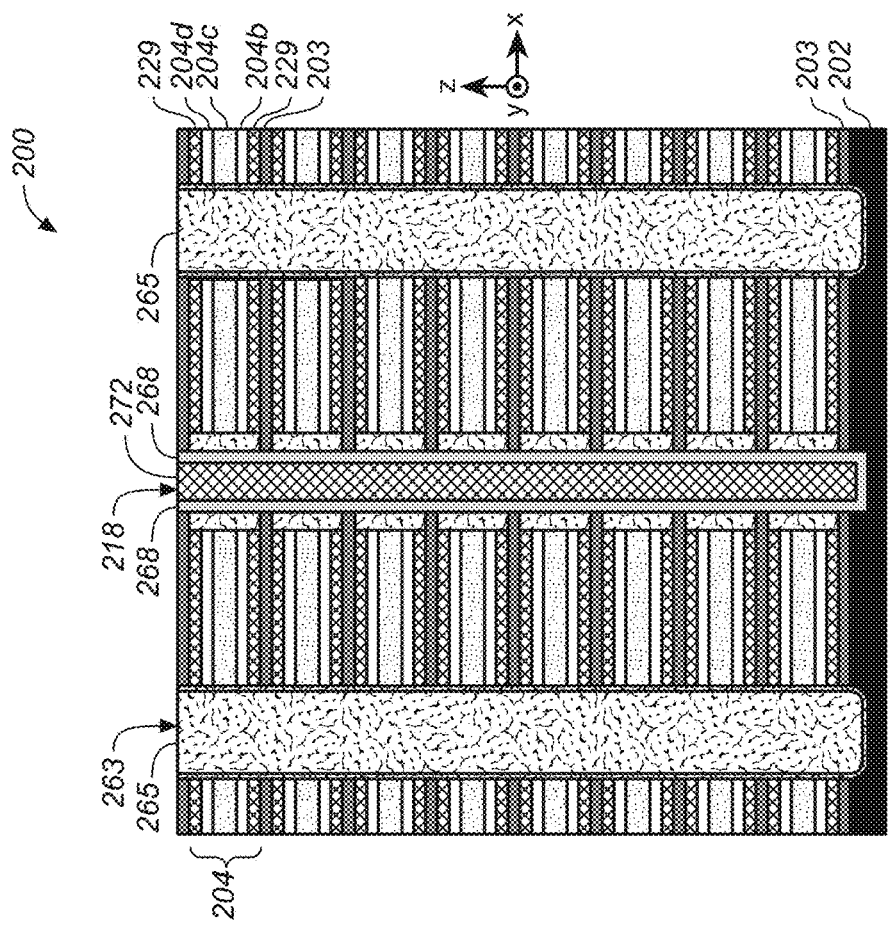
FIGS. 2m(i) and 2m(ii) show, respectively, a top view and a cross section view (in an X-Z plane along line A-A' of FIG. 2m(i)) of resulting memory structure 200, after conductive material 272 is deposited into trenches 218, according to one embodiment of the present invention.
Figure 2M:
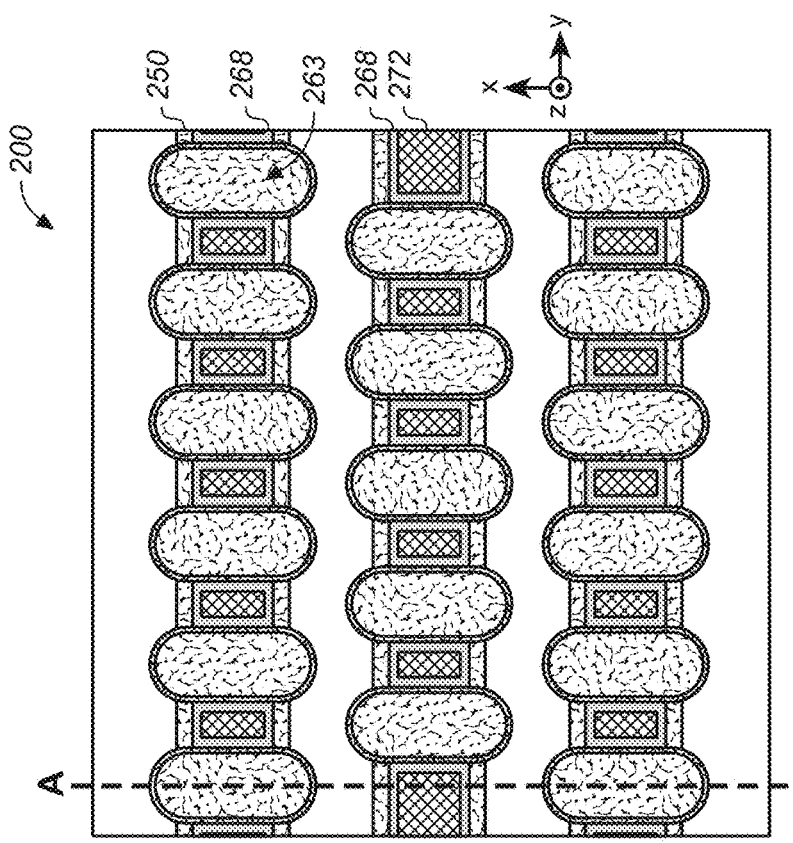

The conductive material may include a metal liner (e.g., titanium (Ti), titanium nitride (TiN), tantalum (Ta) or tantalum nitride (TaN)) and a refractory metal (e.g., tungsten (W), tungsten nitride (WN) or molybdenum (Mo)).

a tunnel dielectric layer (e.g., silicon oxide), a storage layer (e.g., silicon nitride), and a blocking dielectric layer (e.g., silicon oxide, aluminum oxide, or both). Trenches 218 can then be filled by conductive material 272 (e.g., tungsten, with an TiN adhesion layer), which forms a gate electrode (i.e., the "word line" or the "local word line") for a storage cell in each active multi-layer 240 along the gate electrode's length. Formed in this manner, the gate electrode may be 60 nm×60 nm or less. A planarization step (e.g., CMP) may be used to remove excess conductive material 272 from the top surface of memory structure 200. A top view and a cross section view (in an X-Z plane along line A-A' of FIG. 2m(i)) of resulting memory structure 200, after conductive material 272 is deposited into trenches 218 and planarized, are shown in FIGS. 2m(i) and 2m(ii), respectively, according to one embodiment of the present invention.

Figure 2N:
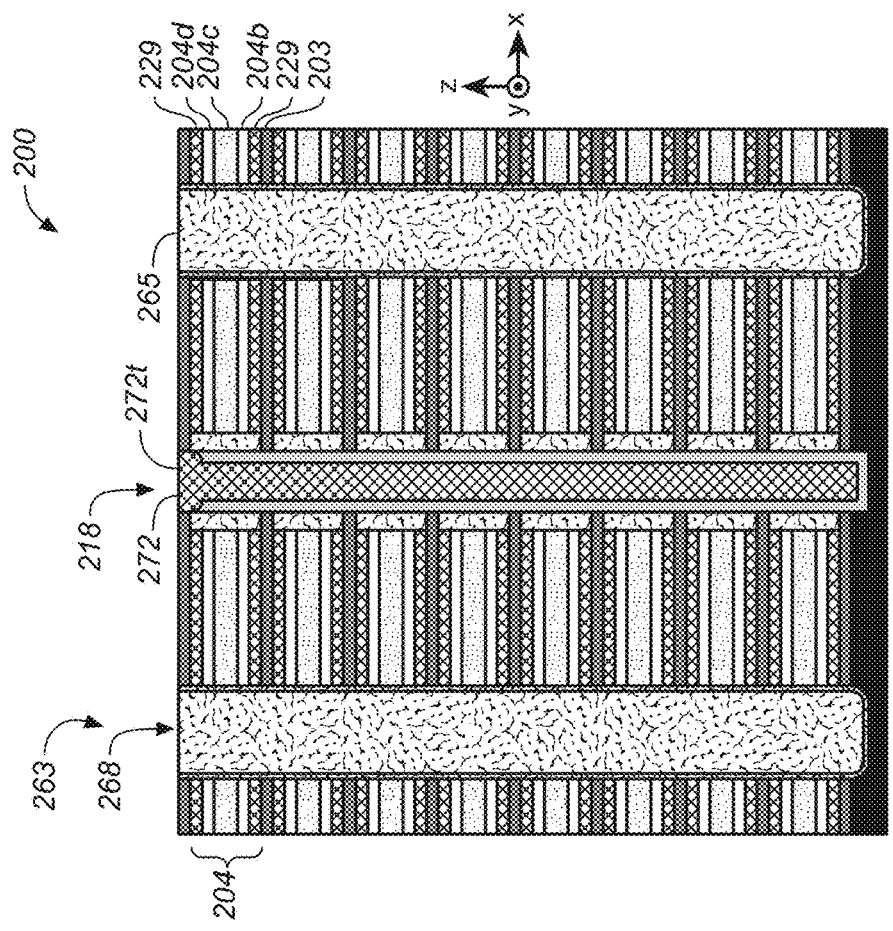
FIGS. 2n(i) and 2n(ii) show, respectively, a top view and a cross section view (in an X-Z plane along line A-A' of FIG. 2n(i)) of resulting memory structure 200, after cap 272t has been formed to protect charge-trapping layer 268, according to one embodiment of the present invention.
Figure 2N:
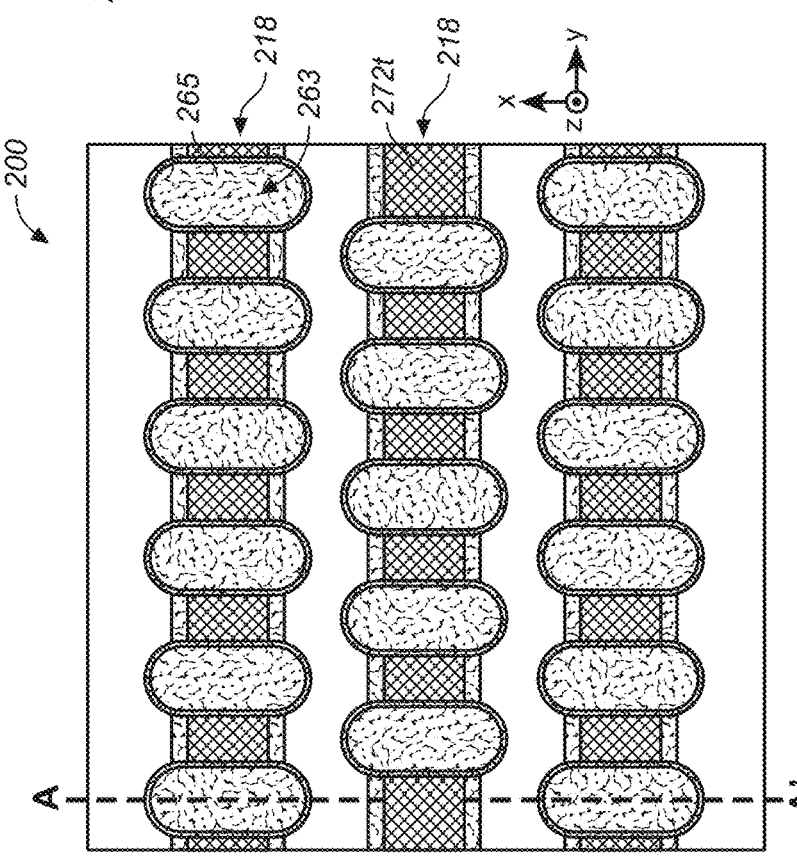

Cap 272t may be provided to facilitate contact to the underlying word line and to protect charge-trapping layer 268 in subsequent processing steps. The cap may be formed using additional masking, patterning, depositing (consisting of conductive material 272). and planarization steps. A top view and a cross section view (in an X-Z plane along line A-A' of FIG. 2n(i)) of resulting memory structure 200, after cap 272t is formed, are shown in FIGS. 2n(i) and 2n(ii), respectively, according to one embodiment of the present invention.

Figure 2O:
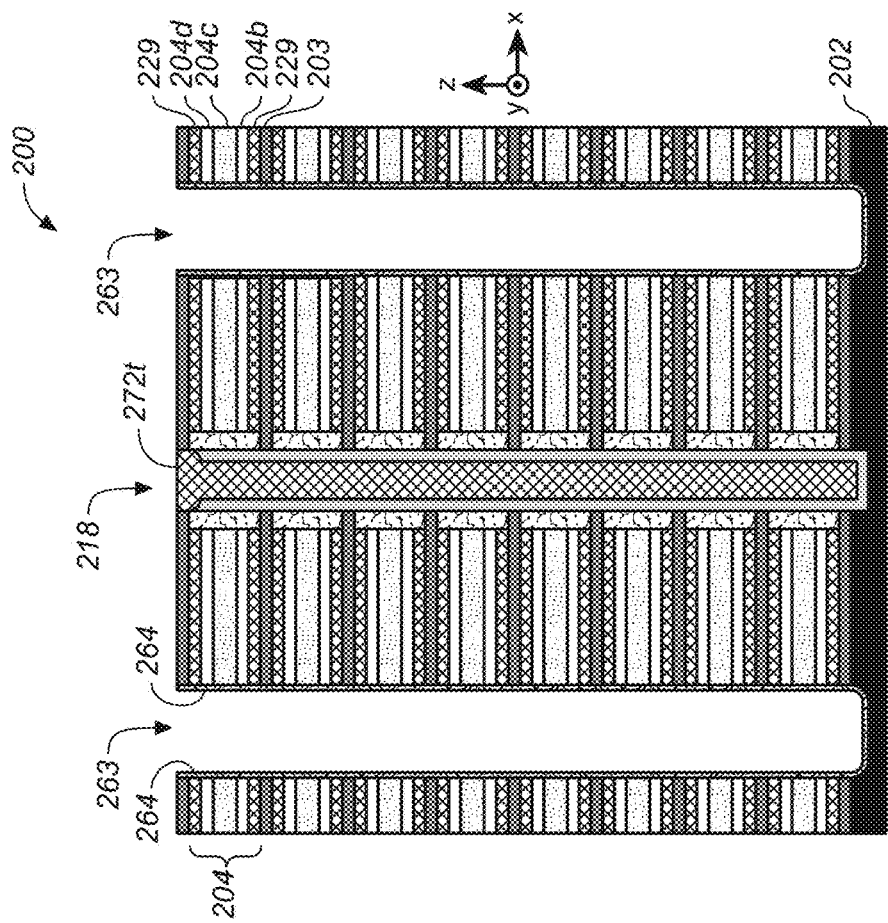
FIGS. 2o(i) and 2o(ii) show, respectively, a top view and a cross section view (in an X-Z plane along line A-A' of FIG. 2o(i)) of resulting memory structure 200, after sacrificial amorphous silicon 265 is removed, according to one embodiment of the present invention.
Figure 2O:
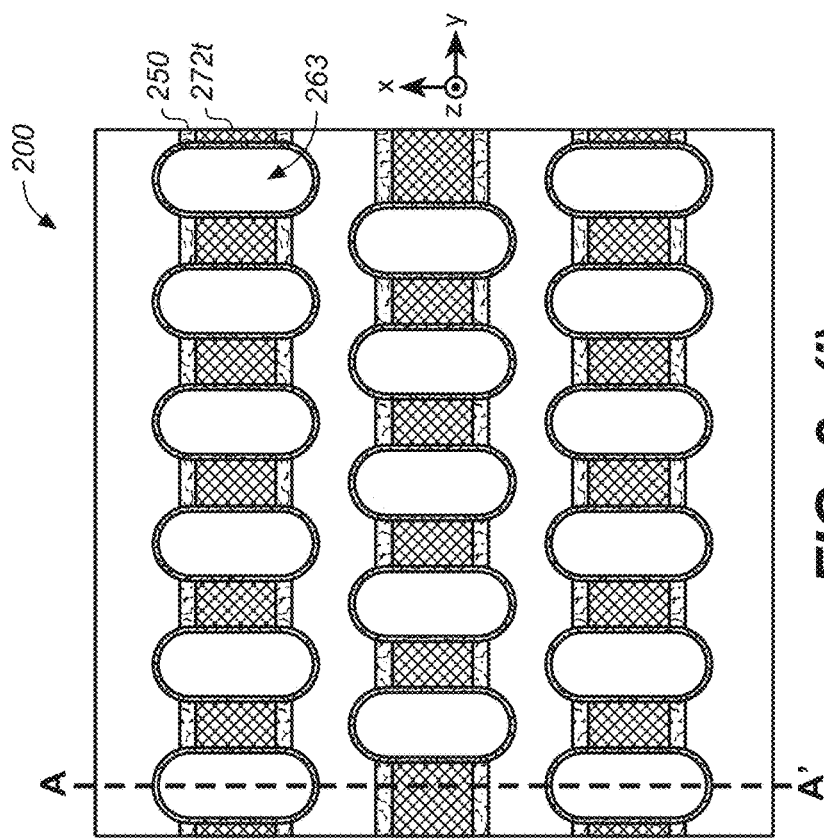

Sacrificial amorphous silicon 265 may then be removed from shafts 263 and replaced by a silicon oxide to serve as the isolation between thin-film storage transistors. Excess silicon oxide on the top surface of memory structure 200 may be removed by a planarization step (e.g., CMP). Shafts 263 may also be left unfilled, allowing the air gaps to serve as the isolation between thin-film storage transistors. A top view and a cross section view (in an X-Z plane along line A-A' of FIG. 2o(i)) of resulting memory structure 200, after sacrificial amorphous silicon 265 is removed, are shown in FIGS. 2o(i) and 2o(ii), respectively, according to one embodiment of the present invention. At this point, the process for forming of a 3-dimensional NOR memory string array is substantially complete without requiring etching of conductive material 272 to form the word lines. Conventional interconnection layers, programmable switch circuits and other useful circuit may be formed above memory structure 200 in a conventional manner.

Figure 2P:
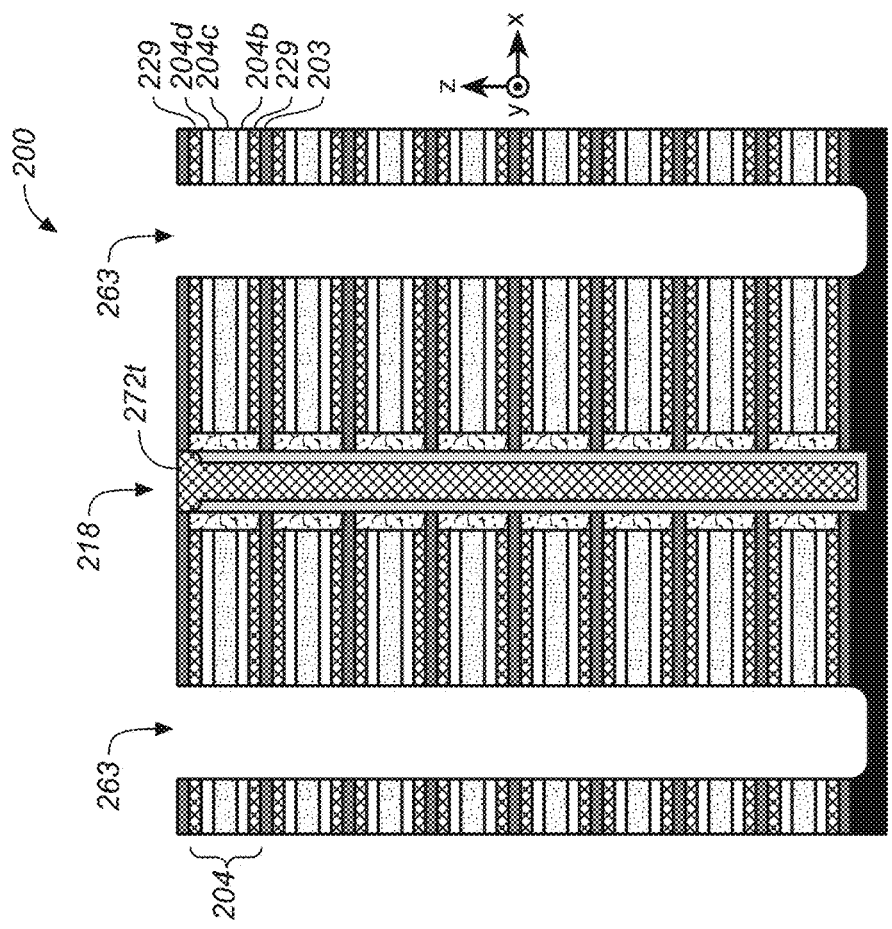
FIGS. 2p(i) and 2p(ii) show, respectively, a top view and a cross section view (in an X-Z plane along line A-A' of FIG. 2p(i)) of resulting memory structure 200, after silicon nitride liner 264 is removed, according to an alternative embodiment of the present invention.
Figure 2P:
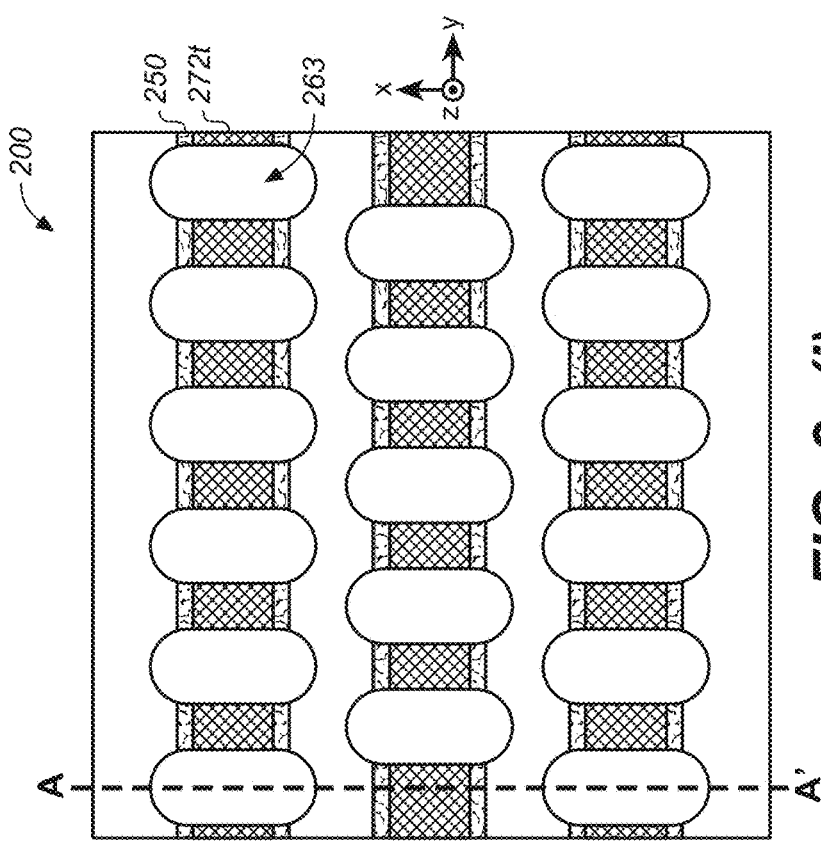

In the process described in detail above, channel polysilicon 250 is formed early in the manufacturing process (e.g., prior to formation of shafts 263, which is described above in conjunction with FIGS. 2j(i) and 2j(ii). To have a higher quality channel region in each thin-film storage transistor, an alternative embodiment replaces channel polysilicon 250 after sacrificial amorphous silicon 265 is removed. According to this alternative embodiment of the present invention, after amorphous silicon 265 is removed, silicon nitride liner 264 is also removed. A top view and a cross section view (in an X-Z plane along line A-A' of FIG. 2p(i)) of resulting memory structure 200, after silicon nitride liner 264 is removed, are shown in FIGS. 2p(i) and 2p(ii), respectively, according to an alternative embodiment of the present invention.

Figure 2Q:
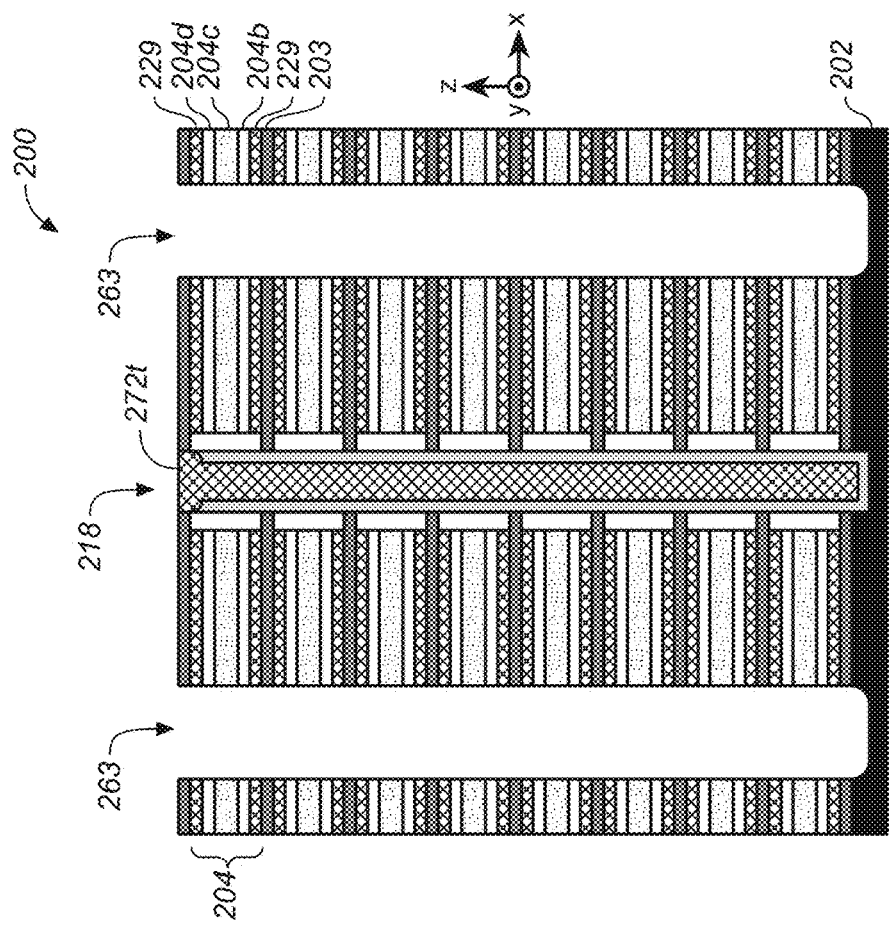
FIGS. 2q(i) and 2q(ii) show, respectively, a top view and a cross section view (in an X-Z plane along line A-A' of FIG. 2q(i)) of resulting memory structure 200, after channel polysilicon 250 is removed, according to an alternative embodiment of the present invention.
Figure 2Q:
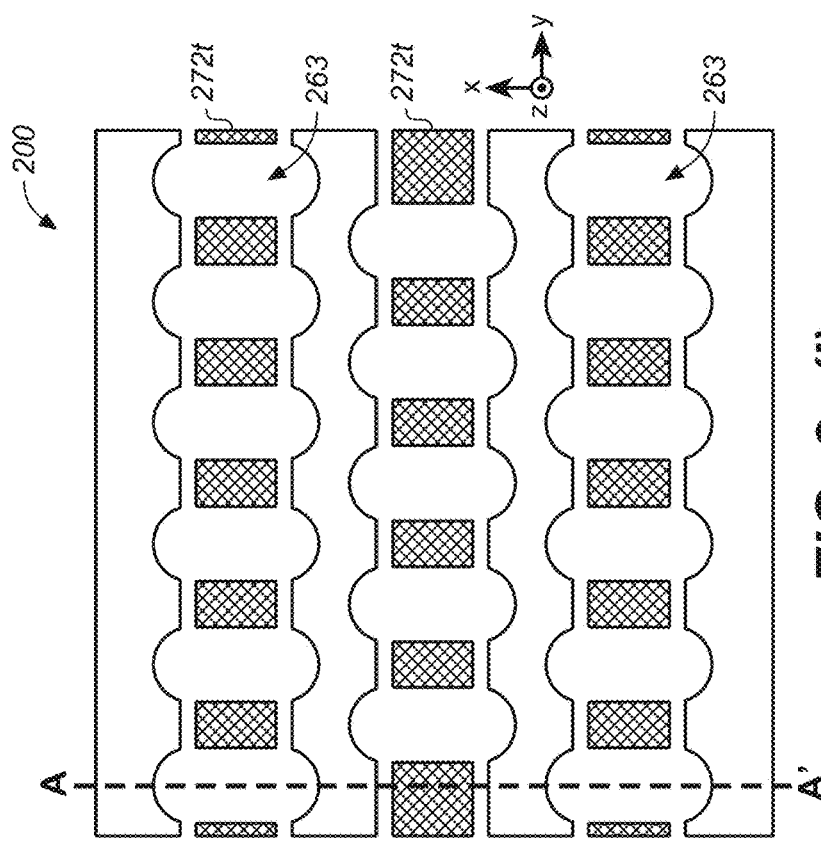

Thereafter, channel polysilicon 250 is removed by, for example, a wet etch. A top view and a cross section view (in an X-Z plane along line A-A' of FIG. 2q(i)) of resulting memory structure 200, after removal of channel polysilicon 250, are shown in FIGS. 2q(i) and 2q(ii), respectively, according to an alternative embodiment of the present invention.

Figure 2R:
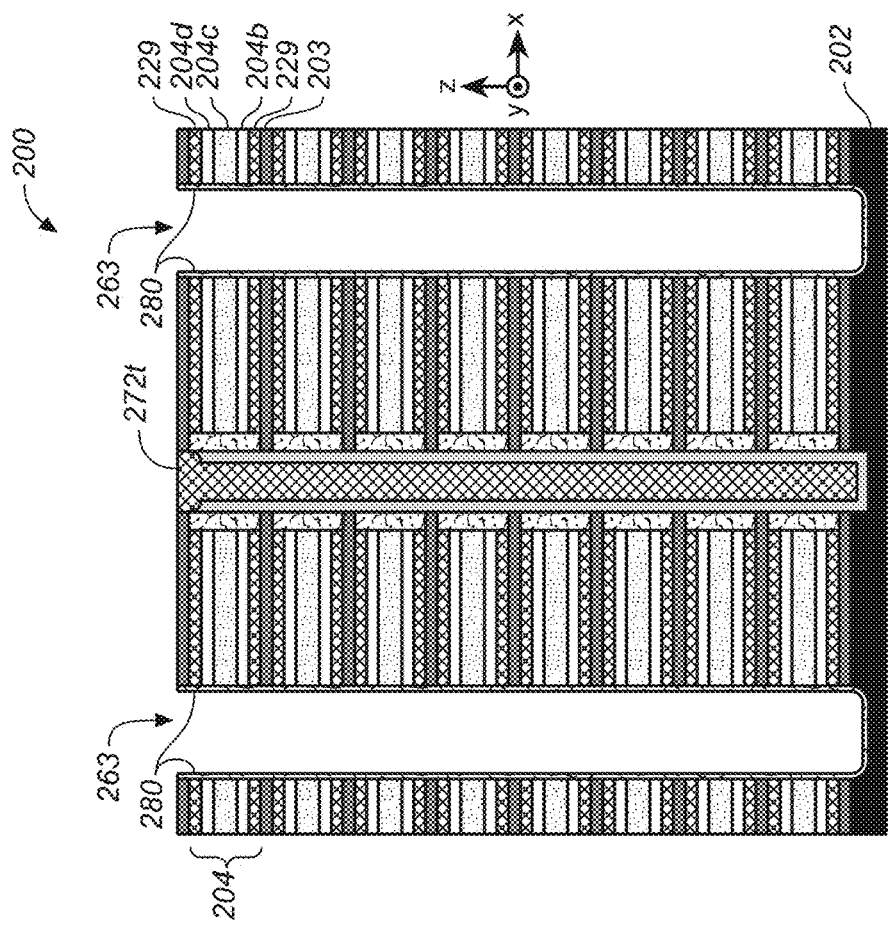
FIGS. 2r(i) and 2r(ii) show, respectively, a top view and a cross section view (in an X-Z plane along line A-A' of FIG. 2r(i)) of resulting memory structure 200, after channel polysilicon 280 is deposited, according to an alternative embodiment of the present invention.
Figure 2R:
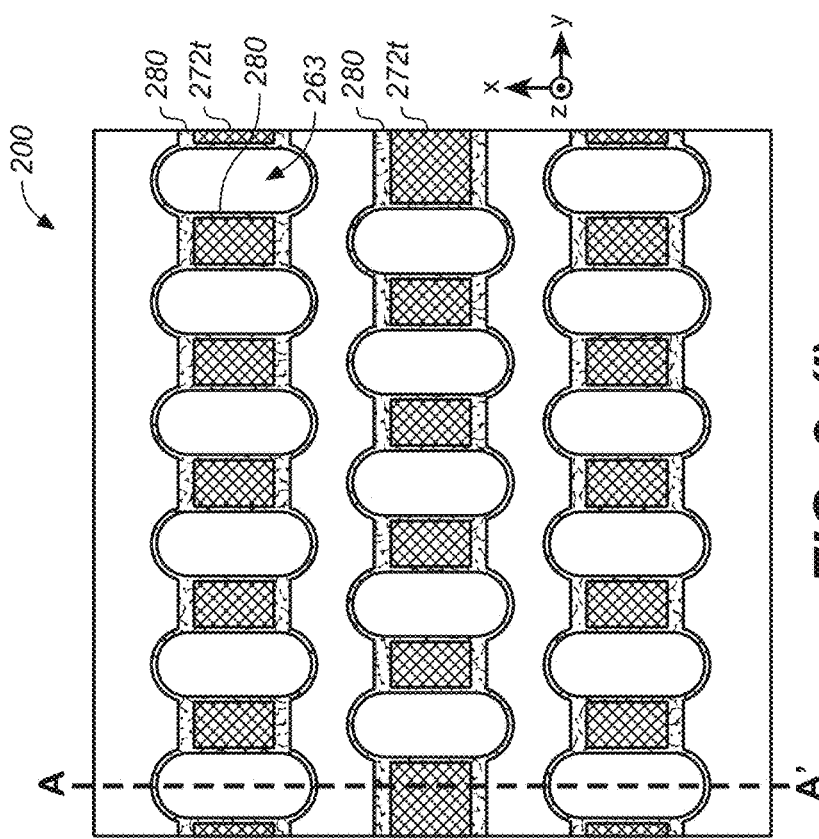

P⁻-doped channel polysilicon 280 is then deposited into the cavities resulting from removing channel polysilicon 250 from underneath charge-trapping layer 268, for example, and up to 10 nm on the sidewalls of shafts 263. A top view and a cross section view (in an X-Z plane along line A-A' of FIG. 2r(i)) of resulting memory structure 200, after deposition of channel polysilicon 280, are shown in FIGS. 2r(i) and 2r(ii), respectively, according to an alternative embodiment of the present invention.

Figure 2S:
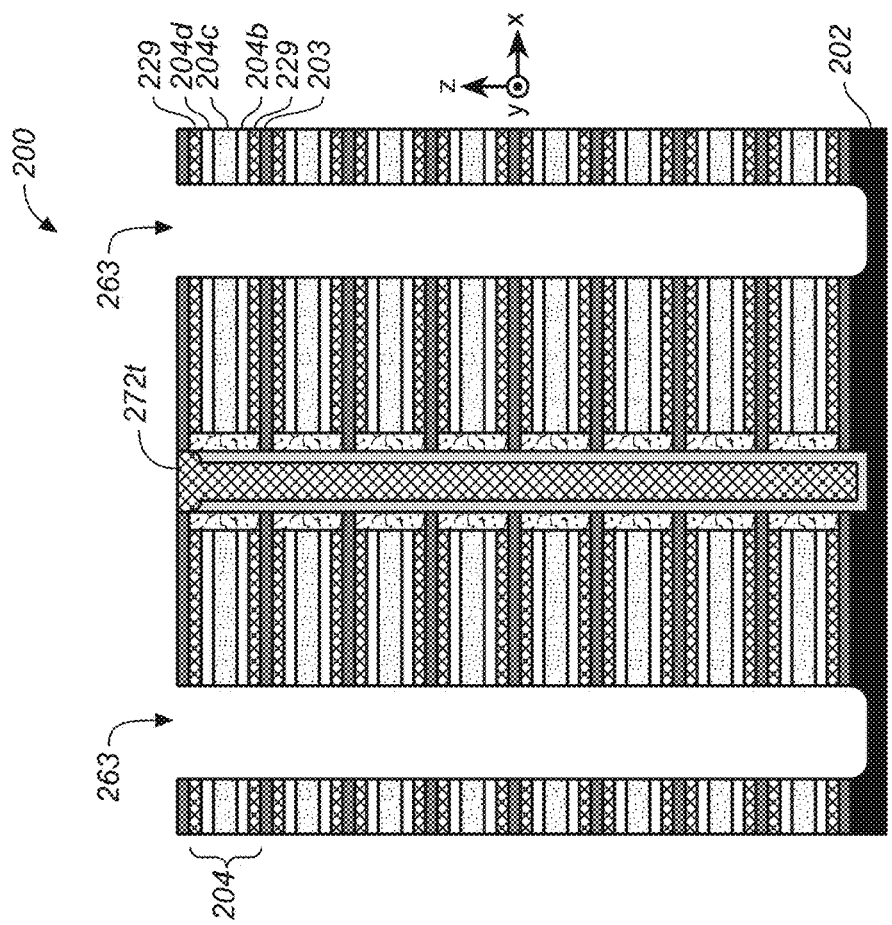
FIGS. 2s(i) and 2s(ii) show, respectively, a top view and a cross section view (in an X-Z plane along line A-A' of FIG. 2s(i)) of resulting memory structure 200, after channel polysilicon 280 is recessed, according to an alternative embodiment of the present invention.
Figure 2S:
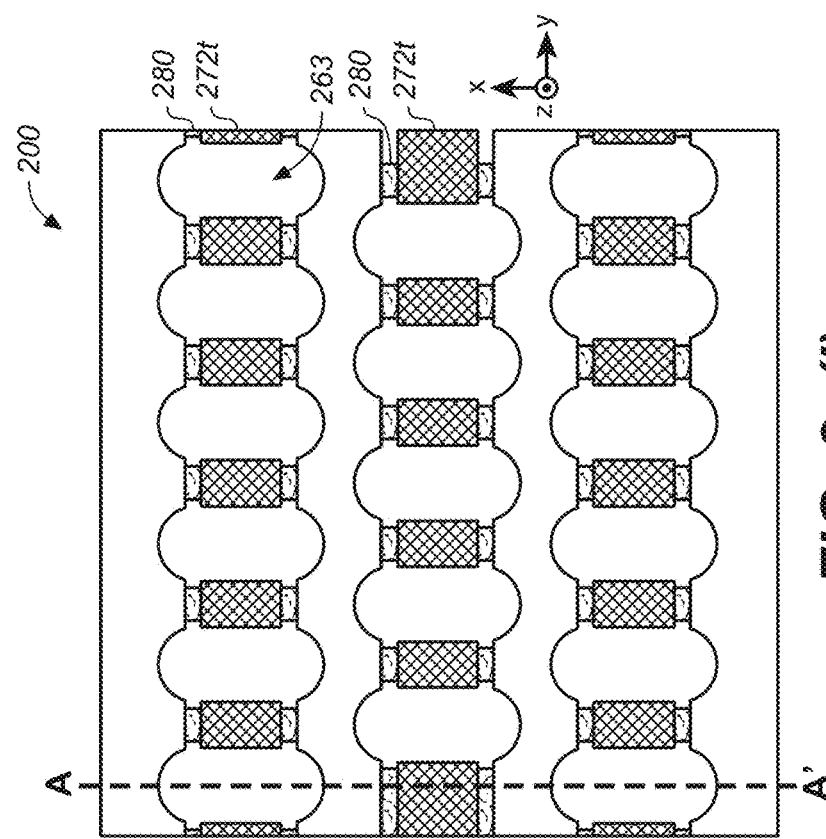

Channel polysilicon 280 may be recessed to provide greater isolation. A top view and a cross section view (in an X-Z plane along line A-A' of FIG. 2s(i)) of resulting memory structure 200, after recess of channel polysilicon 280, are shown in FIGS. 2s(i) and 2s(ii), respectively, according to an alternative embodiment of the present invention.

Figure 2T:
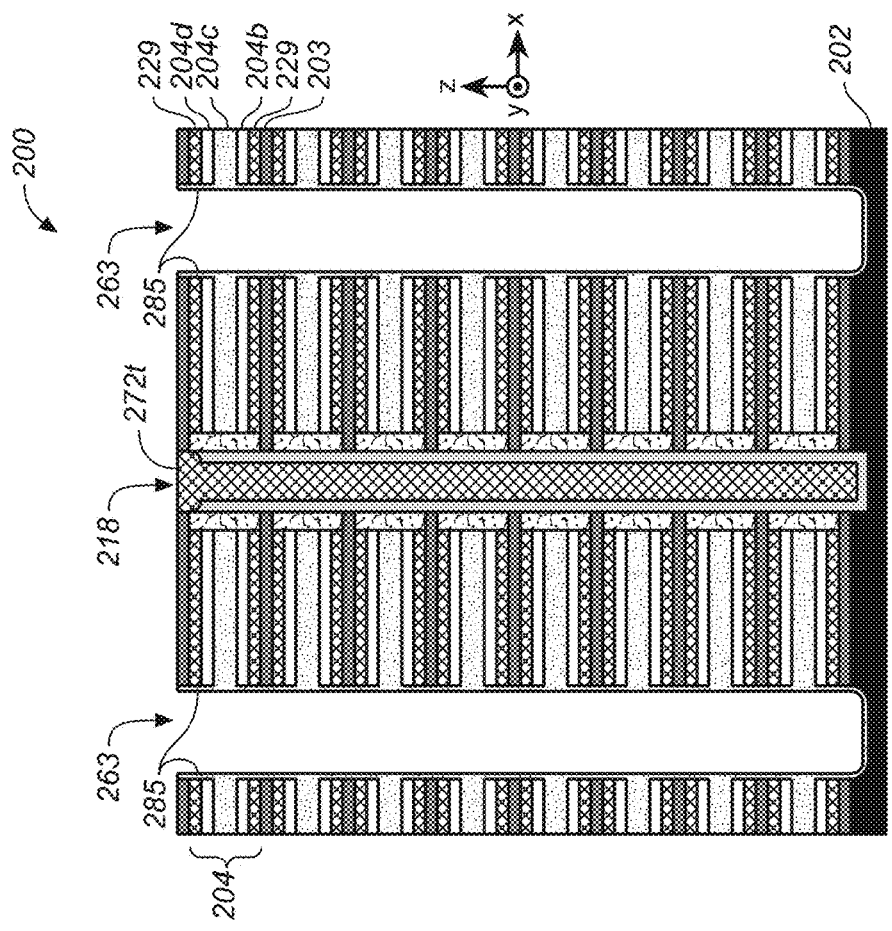
FIGS. 2t(i) and 2t(ii) show, respectively, a top view and a cross section view (in an X-Z plane along line A-A' of FIG. 2t(i)) of resulting memory structure 200, after ALD oxide liner 285 is deposited, according to an alternative embodiment of the present invention.
Figure 2T:
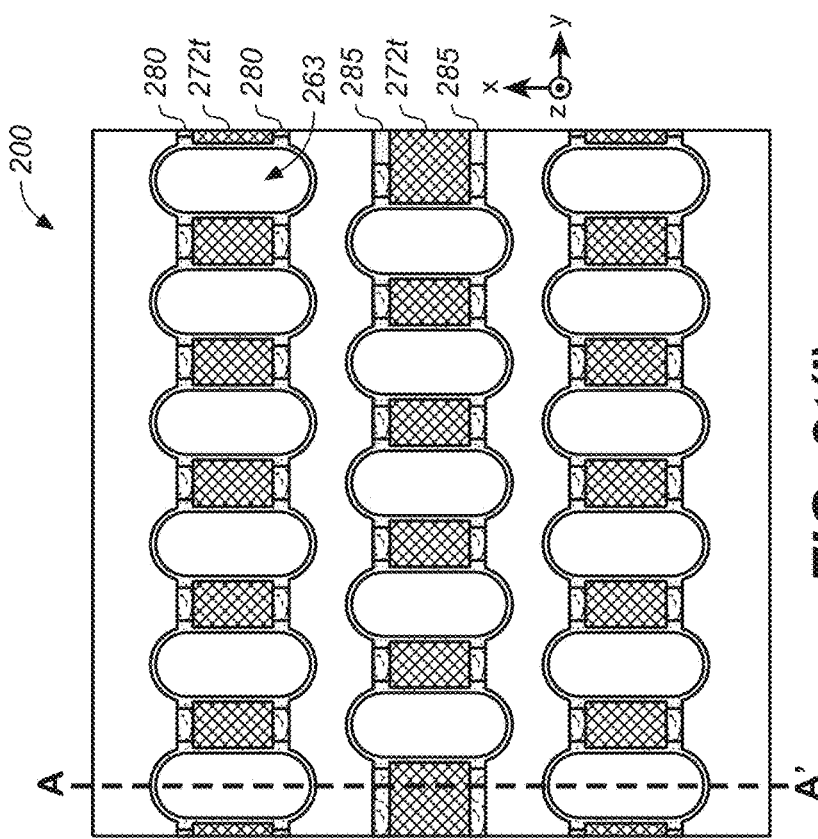

Thereafter, an ALD silicon oxide liner 285 (e.g., 10 nm) is deposited into the recesses of channel polysilicon 280 and on the sidewalls of shafts 263 to provide separation. A top view and a cross section view (in an X-Z plane along line A-A' of FIG. 2t(i)) of resulting memory structure 200, after deposition of ALD oxide liner 285, are shown in FIGS. 2t(i) and 2t(ii), respectively, according to an alternative embodiment of the present invention.

A silicon oxide may be deposited into shafts 263 to serve as the isolation between thin-film storage transistors. Excess silicon oxide on the top surface of memory structure 200 may be removed by a planarization step (e.g., CMP). Shafts 263 may also be left unfilled, allowing the air gaps to serve as the isolation between thin-film storage transistors.

The above detailed description is provided to illustrate specific embodiments of the present invention and is not intended to be limiting. Numerous variations and modifications within the scope of the present invention are possible. The present invention is set forth in the accompanying claims.

We claim:

1. A process, comprising:
   providing over a planar surface of a semiconductor substrate first and second multi-layer structures that are separated by a trench with a predetermined width, as measured along a first direction that is substantially parallel the planar surface, each multi-layer structure comprising a plurality of multi-layer active strips each extending lengthwise along a second direction that is substantially orthogonal to the first direction and which are stacked one on top of another along a third direction that is substantially normal to the planar surface, wherein adjacent ones of the multi-layer active strips are electrically isolated from each other by a layer of an isolation material, and wherein each active multi-layer strip comprises first and second conductive layers separated by a dielectric material;
   recessing the sidewalls of the trench at the multi-layer strips along the first direction, thereby creating recesses between adjacent layers of isolation material; providing in the recesses a predetermined material; filling the trench with a first filler material; forming first and second shafts at a predetermined distance along the second direction by removing in each shaft a portion of each multi-layer strip from each of the first and second multi-layer structures and a portion of the isolation material from the trench;
   filling the first and second shafts with a second filler material;
   removing the first filler material from the trench between the first and second shafts;
   providing a data storage layer conformally on the sidewalls of the trench and filling the remainder of the trench with a conductive material.

2. The process of claim 1, wherein the isolation material comprises silicon oxycarbide (SiOC).

3. The process of claim 1, wherein the data storage layer comprises a tunneling layer, a charge storage layer and a blocking layer.

4. The process of claim 3, wherein the tunneling layer comprises one or more of: any silicon oxide ($SiO_x$), silicon nitride (SiN), silicon oxynitride (SiON), any aluminum oxide ($AlO_x$), any hafnium oxide ($HfO_x$), zirconium oxide ($ZrO_x$), any hafnium silicon oxide ($HfSi_xO_y$), and any hafnium zirconium oxide (HfZrO).

5. The process of claim 3, wherein the blocking layer comprises one or more of: any silicon oxide ($SiO_x$) and any aluminum oxide ($AlO_x$).

6. The process of claim 3, wherein the charge storage layer comprises one or more of: silicon nitride (SiN), hafnium oxide ($HfO_2$), and hafnium silicon oxynitride (HfSiON).

7. The process of claim 1, wherein the conductive material comprises a metal liner and a refractory metal.

8. The process of claim 7, wherein the metal liner comprises one or more of: titanium (Ti), titanium nitride (TiN), tantalum (Ta) and tantalum nitride (TaN).

9. The process of claim 7, wherein the refractory metal comprises one or more of: tungsten (W), tungsten nitride (WN) and molybdenum (Mo).

10. The process of claim 1, wherein the first filler material comprises silicon oxide.

11. The process of claim 1, further comprising forming a cap over both the data storage layer and the conductive material in the trench.

12. The process of claim 1, wherein the predetermined material comprises a semiconductor layer.

13. The process of claim 12, wherein providing a dielectric liner on the sidewalls of the first and second shafts prior to filling the shafts with the second filler material.

14. The process of claim 13, wherein the dielectric liner comprises silicon nitride.

15. The process of claim 13, wherein the second filler material comprises silicon oxide.

16. The process of claim 13, further comprising, after filling the trench with the conductive material, removing the second filler material and replacing it with the isolation material.

17. The process of claim 11, further comprising, after forming the cap, removing the second filler material from the shafts and the predetermined material, and replacing the predetermined material with a semiconductor layer.

18. The process of claim 17, further comprising, after replacing the predetermined material, sealing the semiconductor layer at the shafts with an atomic layer deposition (ALD) silicon oxide liner.

19. The process of claim 18, further comprising, after providing the ALD silicon oxide liner, filling the shaft with the isolation material.

20. The process of claim 1, wherein the first and second conductive layers of each multi-layer active strip, the data storage layer, the conductive material provide a common bit line, a common source line, a charge storage layer and a gate electrode, respectively, of a thin-film storage transistor in a NOR memory string.

21. The process of claim 1, wherein the trench is one of a plurality of trenches created in a multi-layer structure, and wherein the trenches are formed by a plurality of high aspect ratio etches.

22. The process of claim 21, wherein each high aspect ratio etches has an aspect ratio less than 50.

23. The process of claim 1, wherein each multi-layer active strip further comprises a metal layer adjacent and in contact with one or more of the first and second conductive layers.

24. The process of claim 23, wherein the metal layers of the multi-layer active strips replace a sacrificial material that was in place prior to forming the trench.

25. The process of claim 1, further comprising providing an etch stop layer between the first and second multi-layer structures and the planar surface of the semiconductor substrate.

26. The process of claim 25, wherein the etch stop layer includes one or more of tungsten (W), tungsten nitride (WN), aluminum oxide (AlO) or aluminum nitride (AlN).

27. The process of claim 25, further comprising a pad oxide layer between the etch stop layer and the planar surface of the semiconductor substrate.

* * * * *